(12) United States Patent
Maruyama

(10) Patent No.: US 11,919,124 B2
(45) Date of Patent: Mar. 5, 2024

(54) PAD-TEMPERATURE REGULATING APPARATUS, METHOD OF REGULATING PAD-TEMPERATURE, POLISHING APPARATUS, AND POLISHING SYSTEM

(71) Applicant: EBARA CORPORATION, Tokyo (JP)

(72) Inventor: Toru Maruyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 257 days.

(21) Appl. No.: 17/417,294

(22) PCT Filed: Dec. 19, 2019

(86) PCT No.: PCT/JP2019/049832
§ 371 (c)(1),
(2) Date: Jun. 22, 2021

(87) PCT Pub. No.: WO2020/137802
PCT Pub. Date: Jul. 2, 2020

(65) Prior Publication Data
US 2022/0072679 A1    Mar. 10, 2022

(30) Foreign Application Priority Data

Dec. 28, 2018  (JP) .................................. 2018-247771
Dec. 18, 2019  (JP) .................................. 2019-228041

(51) Int. Cl.
*B24B 37/015*    (2012.01)
*B24B 37/20*    (2012.01)
*B24B 49/14*    (2006.01)

(52) U.S. Cl.
CPC ............ *B24B 37/015* (2013.01); *B24B 37/20* (2013.01); *B24B 49/14* (2013.01)

(58) Field of Classification Search
CPC ..... B24B 37/015; B24B 37/005; B24B 37/04; B24B 37/042; B24B 37/10; B24B 37/105;
(Continued)

(56) References Cited

U.S. PATENT DOCUMENTS 5,916,012 A  *  6/1999  Pant ........................ B24B 21/04
                                                                    451/287
2003/0055526 A1 *  3/2003  Avanzino ............. B24B 37/015
                                                                    216/84
(Continued)

FOREIGN PATENT DOCUMENTS

CN      106425863 A   *   2/2017    ............. B24B 51/00
JP      H03-201008 A        9/1991
(Continued)

OTHER PUBLICATIONS

English translation of JP 2017148933A (Year: 2017).*
(Continued)

*Primary Examiner* — Joel D Crandall
*Assistant Examiner* — Sukwoo James Chang
(74) *Attorney, Agent, or Firm* — PEARNE & GORDON LLP

(57) ABSTRACT

The present application relates to a pad-temperature regulating apparatus for regulating a temperature of a surface of a polishing pad. The pad-temperature regulating apparatus includes a pad-contact member, a supply system for supplying a heating liquid and a cooling liquid into the pad contact member, a pad-temperature measuring device for measuring the temperature of the surface of the polishing pad, and a controller for performing a PID control of manipulated variables of a first flow control valve and a second flow control valve. The controller includes a memory in which a learned model constructed to maintain a temperature behavior curve, created based on measured values of the pad-temperature measuring device, within a predetermined allowable range, is stored; and a processing device which inputs at least one temperature behavior parameter to the learned model, and performs a calculation to output a change value of PID parameter for the PID control.

22 Claims, 16 Drawing Sheets

(58) Field of Classification Search
CPC ......... B24B 37/20; B24B 49/14; B24B 55/02; B24B 55/03; B24B 7/228
See application file for complete search history.

(56) References Cited

U.S. PATENT DOCUMENTS

| | | | |
|---|---|---|---|
| 2018/0207768 A1* | 7/2018 | Shibuya | B24B 49/12 |
| 2018/0352144 A1* | 12/2018 | Miao | G06F 18/241 |
| 2019/0095797 A1* | 3/2019 | Dhandapani | B24B 37/20 |

FOREIGN PATENT DOCUMENTS

| | | | |
|---|---|---|---|
| JP | 2017-148933 A | 8/2017 | |
| JP | 2017-175264 A | 9/2017 | |
| JP | 2018-027582 A | 2/2018 | |
| WO | WO03057407 A1 * | 7/2003 | ............. B24B 37/04 |

OTHER PUBLICATIONS

English translation of CN106425863A (Year: 2017).*
International Search Report dated Feb. 18, 2020 issued in Application No. PCT/2019/049832.

* cited by examiner

FIG. 8

DATA SET D1 (MEASUREMENT TIME POINT T1)

|  | WAFER 1 | WAFER 2 | WAFER 3 | ... | WAFER 100 |
|---|---|---|---|---|---|
| PAD SURFACE TEMPERATURE | 25.2 | 24.9 | 25.1 | ... | 25.5 |

DATA SET D2 (MEASUREMENT TIME POINT T2)

|  | WAFER 1 | WAFER 2 | WAFER 3 | ... | WAFER 100 |
|---|---|---|---|---|---|
| PAD SURFACE TEMPERATURE | 25.4 | 25.0 | 25.2 | ... | 25.5 |

DATA SET D3 (MEASUREMENT TIME POINT T3)

|  | WAFER 1 | WAFER 2 | WAFER 3 | ... | WAFER 100 |
|---|---|---|---|---|---|
| PAD SURFACE TEMPERATURE | 25.4 | 25.4 | 25.8 | ... | 25.8 |

•
•
•

DATA SET Dn (MEASUREMENT TIME POINT Tn)

|  | WAFER 1 | WAFER 2 | WAFER 3 | ... | WAFER 100 |
|---|---|---|---|---|---|
| PAD SURFACE TEMPERATURE | 55.7 | 55.1 | 54.8 | ... | 55.0 |

PAD-TEMPERATURE REGULATING APPARATUS, METHOD OF REGULATING PAD-TEMPERATURE, POLISHING APPARATUS, AND POLISHING SYSTEM

TECHNICAL FIELD

The present invention relates to a pad-temperature regulating apparatus and a pad-temperature regulating method for regulating a surface temperature of a polishing pad used for polishing of a substrate, such as a wafer. Further, the present invention relates to a polishing apparatus in which the pad-temperature regulating apparatus is incorporated, and a polishing system including at least one polishing apparatus.

BACKGROUND ART

A CMP (Chemical Mechanical Polishing) apparatus is used in a process of polishing a surface of a substrate, such as a wafer, in the manufacturing of a semiconductor device. The CMP apparatus has at least one polishing unit, and the polishing unit is configured to hold and rotate the wafer with a polishing head, and press the wafer against a polishing pad on a rotating polishing table to polish the surface of the wafer. During polishing, a polishing liquid (or slurry) is supplied onto the polishing pad, so that the surface of the wafer is planarized by the chemical action of the polishing liquid and the mechanical action of abrasive grains contained in the polishing liquid.

A polishing rate of the wafer depends not only on a polishing load on the wafer pressed against the polishing pad, but also on a surface temperature of the polishing pad. This is because the chemical action of the polishing liquid on the wafer depends on the temperature. Therefore, in the manufacturing of a semiconductor device, it is important to maintain an optimum surface temperature of the polishing pad during polishing of the wafer in order to increase the polishing rate of the wafer, and to keep the increased polishing rate constant.

From this viewpoint, a pad-temperature regulating apparatus is conventionally used to regulate a surface temperature of a polishing pad (see Patent document 1 and Patent document 2, for example). The pad-temperature regulating apparatus typically includes a pad contact member capable of contacting the polishing pad, a liquid supply system for supplying a heating liquid having a regulated temperature and a cooling liquid having a regulated temperature into the pad contact member, a pad-temperature measuring device for measuring a surface temperature of the polishing pad, and a controller for controlling the liquid supply system based on the surface temperature of the polishing pad measured by the pad-temperature measuring device. The controller controls the flow rates of the heating liquid and the cooling liquid based on the pad surface temperature measured by the pad-temperature measuring device such that the surface temperature of the polishing pad reach a predetermined target temperature and is subsequently maintained at the target temperature. For example, the controller controls, based on a difference between the target temperature and the surface temperature of the polishing pad, a manipulated variable for a flow control valve arranged in a heating-liquid supply pipe and a manipulated variable for a flow control valve arranged in a cooling-liquid supply pipe, of the liquid supply system, by PID-controlling to thereby control the flow rates of the heating liquid and the cooling liquid supplied into the pad contact member. This operation allows the surface temperature of the polishing pad to quickly reach an optimum value and to be maintained at this optimum value.

CITATION LIST

Patent Literature

Patent document 1: Japanese laid-open patent publication No. 2017-148933
Patent document 2: Japanese laid-open patent publication No. 2018-027582

SUMMARY OF INVENTION

Technical Problem

The controller of the CMP apparatus stores in advance PID parameters (i.e., proportional gain P, integral gain I, and derivative gain D) used for the above-described PID control. When the CMP apparatus has a plurality of polishing units, the same PID parameters are used to regulate the surface temperature of the polishing pad in each polishing unit. Further, a plurality of CMP apparatuses is often arranged in a manufacturing factory for semiconductor devices and the like. In general, the same PID parameters are stored in the controller of each CMP apparatus. In other words, the plurality of CMP apparatuses uses the PID parameters that are common among these CMP apparatuses, to regulate the surface temperature of the polishing pad of each polishing unit.

However, even though the same PID parameters are used, variations in temperature behavior occur due to machine differences between each polishing unit. In the present specification, the temperature behavior represents a temporal change in the surface temperature of the polishing pad from a time point when the pad contact member starts regulating of the surface temperature of the polishing pad to a time point when the target temperature is reached.

FIG. 19 is a graph showing the temperature behaviors in each of four polishing units. In FIG. 19, a vertical axis represents the surface temperature of the polishing pad, and a horizontal axis represents time. In FIG. 19, a time point Ta corresponds to a time point when the pad contact member contacts the polishing pad, i.e., a time point when the pad contact member has started to regulate the surface temperature of the polishing pad. In FIG. 19, a time point Tb corresponds to a time point when the polishing head holding the wafer is brought into contact with the polishing pad, i.e., a time point when polishing of the wafer is started. In the present specification, a curve illustrating the temperature behavior as shown in FIG. 19 is referred to as the temperature behavior curve.

As shown in FIG. 19, the temperature behavior curves of each polishing unit are different from each other. As described above, the polishing rate of the wafer also depends on the surface temperature of the polishing pad. Therefore, when the temperature behavior differs among the polishing units, the polishing performance also differs among the polishing units. For example, in FIG. 19, a temperature behavior curve R1 is located above a temperature behavior curve R2. This means the polishing performance (polishing rate) differs between the polishing unit having the temperature behavior curve R1, and the polishing unit having the temperature behavior curve R2. If the polishing performance differs between the polishing units, the yield of the product (that is, the semiconductor device) may be adversely affected.

Therefore, in the present invention, there is provided a pad-temperature regulating apparatus and a pad-temperature regulating method capable of suppressing variations of polishing performance between polishing units. Further, in the present invention, there is provided a polishing apparatus in which such pad-temperature regulating apparatus is incorporated, and a polishing system including at least one polishing apparatus.

Solution to Problem

In one embodiment, there is proved a pad-temperature regulating apparatus for reaching a temperature of a surface of a polishing pad to a predetermined target temperature and then maintaining the temperature of the surface of the polishing pad at the target temperature, comprising: a pad contact member which can be placed into contact with the surface of the polishing pad, and has a heating flow passage and a cooling flow passage formed therein; a liquid supply system which includes a heating-liquid supply pipe coupled to the heating flow passage, a cooling-liquid supply pipe coupled to the cooling flow passage, a first flow control valve attached to the heating-liquid supply pipe, and a second flow control valve attached to the cooling-liquid supply pipe, and supplies a heating liquid having a regulated temperature and a cooling liquid having a regulated temperature, into the pad contact member; a pad-temperature measuring device for measuring the temperature of the surface of the polishing pad; and a controller for performing a PID control of manipulated variables of the first flow control valve and the second flow control valve based on a difference between a measured value of the pad-temperature measuring device and the predetermined target temperature, wherein the controller includes: a memory in which a learned model constructed by machine learning to maintain a temperature behavior curve, created based on measured values of the pad-temperature measuring device and measurement time points thereof, within a predetermined allowable range, is stored; and a processing device which inputs at least one temperature behavior parameter to the learned model, and performs a calculation to output a change value of PID parameter for the PID control.

In one embodiment, the learned model is constructed by deep learning by use of neural network, and the controller constructs the learned model by adjusting weight parameters of the neural network such that, when a training data set including the at least one temperature behavior parameter is input to the neural network, the PID parameter to be changed to maintain the temperature behavior curve within the predetermined allowable range and the change value of the PID parameter included in normal range are obtained from the neural network.

In one embodiment, the controller stores the temperature behavior curves which are created every time a substrate is pressed against the polishing pad to be polished, and the at least one temperature behavior parameter associated with the temperature behavior curve, and the training data set is produced from the accumulated at least one temperature behavior parameter.

In one embodiment, the at least one temperature behavior parameter input to the learned model includes the PID parameter of the PID control, a flow rate of the heating liquid, and a flow rate of the cooling liquid.

In one embodiment, a temperature of the heating liquid, a rotation speed of a polishing head for presses a substrate against the polishing pad, the rotation speed of a polishing table to which the polishing pad is attached, dressing conditions of the polishing pad, a polishing load of the polishing head, and a flow rate of a polishing liquid supplied onto the polishing pad are further input to the learned model.

In one embodiment, a pressing load of the pad contact member against the polishing pad, a temperature of a polishing liquid supplied onto the polishing pad, a temperature of atmosphere in a polishing unit in which the pad temperature regulating apparatus is arranged, a supply pressure of the heating liquid, and a supply pressure of the cooling liquid are further input to the learned model.

In one embodiment, a time when the at least one temperature behavior parameter input to the learned model has been acquired is further input to the learned model.

In one embodiment, a film thickness parameter associated with a film thickness of a substrate pressed against the polishing pad is further input to the learned model.

In one embodiment, a height of the polishing pad and a polishing rate of a substrate polished by the polishing pad are further input to the learned model.

In one embodiment, there is provided a pad-temperature regulating method, comprising: flowing a heating liquid and a cooling liquid into a heating flow channel and a cooling flow channel formed in a pad contact member, while the pad contact member is placed in contact with a surface of a polishing pad; measuring a temperature of the surface of the polishing pad; performing a PID control of manipulated variables of a first flow control valve attached to a heating-liquid supply pipe which is coupled to the heating flow channel, and a second flow control valve attached to a cooling-liquid supply pipe which is coupled to the cooling flow channel such that the temperature of the surface of the polishing pad reach a predetermined target temperature and is subsequently maintained at the target temperature; constructing a learned model, by use of machine learning, a learned model for maintaining a temperature behavior curve, which is created based on measured values of the pad temperature measuring device and measurement time points thereof, within a predetermined allowable range; and inputting at least one temperature behavior parameter to the learned model and outputting the change value of a PID parameter of the PID control.

In one embodiment, there is provided a polishing apparatus, comprising: at least one polishing unit including a polishing table for supporting a polishing pad, and a polishing head for pressing a substrate against the polishing pad; and a pad-temperature regulating apparatus for reaching a temperature of a surface of the polishing pad to a predetermined target temperature and then maintaining the temperature of the surface of the polishing pad at the target temperature, wherein the pad-temperature regulating apparatus includes: a pad contact member which can be placed into contact with the surface of the polishing pad, and has a heating flow passage and a cooling flow passage formed therein; a liquid supply system which includes a heating-liquid supply pipe coupled to the heating flow passage, a cooling-liquid supply pipe coupled to the cooling flow passage, a first flow control valve attached to the heating-liquid supply pipe, and a second flow control valve attached to the cooling-liquid supply pipe, and supplies a heating liquid having a regulated temperature and a cooling liquid having a regulated temperature, into the pad contact member; a pad-temperature measuring device for measuring the temperature of the surface of the polishing pad; and a controller for performing a PID control of manipulated variables of the first flow control valve and the second flow control valve based on a difference between a measured value of the pad-temperature measuring device and the predetermined target temperature, wherein the controller includes: a memory in which a learned model constructed by machine learning to maintain a temperature behavior curve, created based on measured values of the pad-temperature measuring device and measurement time points thereof, within a predetermined allowable range, is stored; and a processing device which inputs at least one temperature behavior parameter to the learned model, and performs a calculation to output a change value of PID parameter for the PID control.

In one embodiment, there is provided a A polishing system, comprising: at least one polishing apparatus; a relay device coupled to the polishing unit so as to be capable of transmitting and receiving information with each other; and a host control system coupled to the relay device so as to be capable of transmitting and receiving information with each other, wherein the polishing apparatus includes: at least one polishing unit including a polishing table for supporting a polishing pad, and a polishing head for pressing a substrate against the polishing pad; and a pad-temperature regulating apparatus for reaching a temperature of a surface of the polishing pad to a predetermined target temperature and then maintaining the temperature of the surface of the polishing pad at the target temperature, wherein the pad-temperature regulating apparatus includes: a pad contact member which can be placed into contact with the surface of the polishing pad, and has a heating flow passage and a cooling flow passage formed therein; a liquid supply system which includes a heating-liquid supply pipe coupled to the heating flow passage, a cooling-liquid supply pipe coupled to the cooling flow passage, a first flow control valve attached to the heating-liquid supply pipe, and a second flow control valve attached to the cooling-liquid supply pipe, and supplies a heating liquid having a regulated temperature and a cooling liquid having a regulated temperature, into the pad contact member; a pad-temperature measuring device for measuring the temperature of the surface of the polishing pad; and a controller for performing a PID control of manipulated variables of the first flow control valve and the second flow control valve based on a difference between a measured value of the pad-temperature measuring device and the predetermined target temperature, and wherein a host controller of the host control system includes: a memory in which a learned model constructed by machine learning to maintain a temperature behavior curve, created based on measured values of the pad-temperature measuring device and measurement time points thereof, within a predetermined allowable range, is stored; and a processing device which inputs at least one temperature behavior parameter to the learned model, and performs a calculation to output a change value of PID parameter for the PID control.

In one embodiment, there is provided a polishing system, comprising: at least one polishing apparatus; a relay device coupled to the polishing unit so as to be capable of transmitting and receiving information with each other; and a host control system coupled to the relay device so as to be capable of transmitting and receiving information with each other, wherein the polishing apparatus includes: at least one polishing unit including a polishing table for supporting a polishing pad, and a polishing head for pressing a substrate against the polishing pad; and a pad-temperature regulating apparatus for reaching a temperature of a surface of the polishing pad to a predetermined target temperature and then maintaining the temperature of the surface of the polishing pad at the target temperature, wherein the pad-temperature regulating apparatus includes: a pad contact member which can be placed into contact with the surface of the polishing pad, and has a heating flow passage and a cooling flow passage formed therein; a liquid supply system which includes a heating-liquid supply pipe coupled to the heating flow passage, a cooling-liquid supply pipe coupled to the cooling flow passage, a first flow control valve attached to the heating-liquid supply pipe, and a second flow control valve attached to the cooling-liquid supply pipe, and supplies a heating liquid having a regulated temperature and a cooling liquid having a regulated temperature, into the pad contact member; a pad-temperature measuring device for measuring the temperature of the surface of the polishing pad; and a controller for performing a PID control of manipulated variables of the first flow control valve and the second flow control valve based on a difference between a measured value of the pad-temperature measuring device and the predetermined target temperature, and wherein a relay controller of the relay device includes: a memory in which a learned model constructed by machine learning to maintain a temperature behavior curve, created based on measured values of the pad-temperature measuring device and measurement time points thereof, within a predetermined allowable range, is stored; and a processing device which inputs at least one temperature behavior parameter to the learned model, and performs a calculation to output a change value of PID parameter for the PID control.

Advantageous Effects of Invention

According to the present invention, changing the PID parameters enables the temperature behavior curve to be maintained within the predetermined allowable range. As a result, the variations in polishing performance between the polishing units are suppressed, so that the yield of the products can be improved.

BRIEF DESCRIPTION OF DRAWINGS

FIG. 8 is a schematic view showing an example of a plurality of data sets;

DESCRIPTION OF EMBODIMENTS

Embodiments of the present invention will now be described with reference to the drawings.

Figure 1:
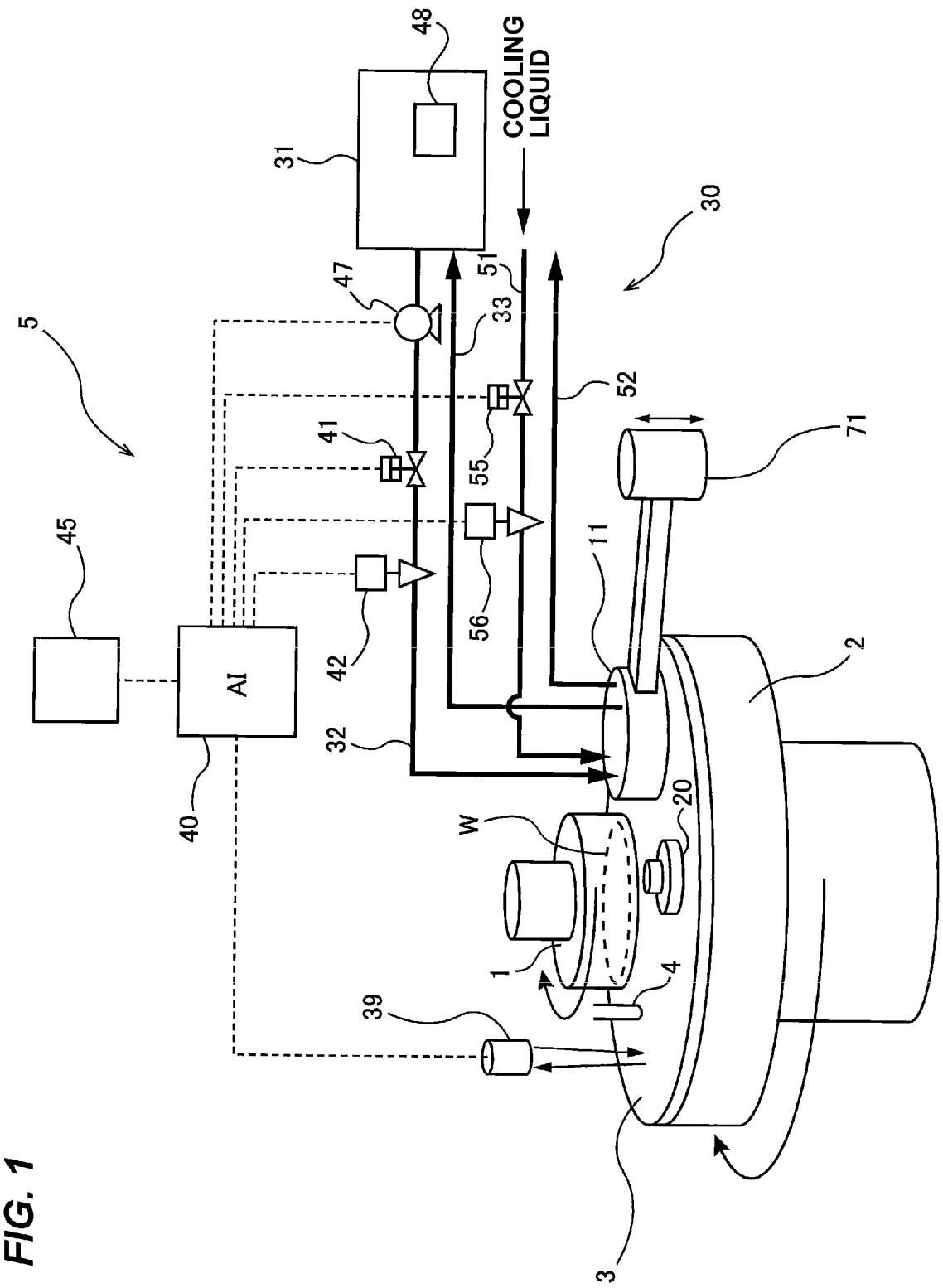
FIG. 1 is a schematic view showing a polishing unit, arranged in a polishing apparatus, according to an embodiment.

FIG. 1 is a schematic view showing a polishing unit, arranged in a polishing apparatus, according to an embodiment. The polishing apparatus is equipped with at least one polishing unit as shown in FIG. 1. As shown in FIG. 1, the polishing unit includes a polishing head 1 for holding and rotating a wafer W which is an example of a substrate, a polishing table 2 that supports a polishing pad 3, a polishing-liquid supply nozzle 4 for supplying a polishing liquid (e.g. a slurry) onto a surface of the polishing pad 3, and a pad-temperature regulating apparatus 5 for regulating a surface temperature of the polishing pad 3. The surface; /e (upper surface) 3a of the polishing pad 3 provides a polishing surface for polishing the wafer W.

The polishing head 1 is vertically movable, and is rotatable about its axis in a direction indicated by arrow. The wafer W is held on a lower surface of the polishing head 1 by, for example, vacuum suction. A motor (not shown) is coupled to the polishing table 2, so that the polishing table 2 can rotate in a direction indicated by arrow. As shown in FIG. 1, the polishing head 1 and the polishing table 2 rotate in the same direction. The polishing pad 3 is attached to the upper surface of the polishing table 2.

The polishing unit further includes a dresser 20 that dresses the polishing pad on the polishing table 2. The dresser 20 is configured to oscillate on the surface of the polishing pad 3 in a radial direction of the polishing pad 3. The dresser 20 has a lower surface serving as a dressing surface constituted by a number of abrasive grains, such as diamond particles. The dresser 20 rotates, while oscillating on the polishing surface of the polishing pad 3, to scrape away the polishing pad 3 slightly, thereby dressing the surface of the polishing pad 3.

Polishing of the wafer W is performed in the following manner. The wafer W, to be polished, is held by the polishing head 1, and is then rotated by the polishing head 1. The polishing pad 3 is rotated together with the polishing table 2. In this state, the polishing liquid is supplied from the polishing-liquid supply nozzle 4 onto the surface of the polishing pad 3, and the surface of the wafer W is then pressed by the polishing head 1 against the surface 3a (i.e. polishing surface) of the polishing pad 3. The surface of the wafer W is polished by the sliding contact with the polishing pad 3 in the presence of the polishing liquid. The surface of the wafer W is planarized by the chemical action of the polishing liquid and the mechanical action of abrasive grains contained in the polishing liquid.

The pad-temperature regulating apparatus 5 includes a pad contact member 11 which can contact the surface of the polishing pad 3, a liquid supply system 30 for supplying a heating liquid having a regulated temperature and a cooling liquid having a regulated temperature into the pad contact member 11, and a controller 40 which controls at least the flow rates of the heating liquid and the cooling liquid such that the surface temperature of the polishing pad reach a predetermined target temperature and then is maintained at the target temperature.

In this embodiment, the controller 40 is configured to control operations of the polishing apparatus as a whole, including the pad-temperature regulating apparatus 5. In the following description, an embodiment in which the controller 40 controls the operations of one polishing unit including the pad-temperature regulating apparatus 5 will be described, but this embodiment is not limited to this example. For example, when the polishing apparatus is equipped with a plurality of polishing units, the controller 40 can control the operations of each polishing unit individually.

The liquid supply system 30 shown in FIG. 1 includes a heating-liquid supply tank 31 as a heating-liquid supply source for storing the heating liquid having a regulated temperature, and a heating-liquid supply pipe 32 and a heating-liquid return pipe 33, each coupling the heating-liquid supply tank 31 to the pad contact member 11. One ends of the heating-liquid supply pipe 32 and the heating-liquid return pipe 33 are coupled to the heating-liquid supply tank 31, while the other ends are coupled to the pad contact member 11.

The heating liquid having a regulated temperature is supplied from the heating-liquid supply tank 31 to the pad contact member 11 through the heating-liquid supply pipe 32, flows in the pad contact member 11, and is retuned from the pad contact member 11 to the heating-liquid supply tank 31 through the heating-liquid return pipe 33. In this manner, the heating liquid circulates between the heating-liquid supply tank 31 and the pad contact member 11. In this embodiment, the heating-liquid supply tank 31 has a heating source (i.e., heater) 48 disposed therein. This heating source 48 heats the heating liquid, stored in the heating-liquid supply tank 31, to the predetermined temperature (i.e., set temperature).

A first on-off valve 41 and a first flow control valve 42 are attached to the heating-liquid supply pipe 32. The first flow control valve 42 is located between the pad contact member 11 and the first on-off valve 41. The first on-off valve 41 is a valve not having a flow rate regulating function, whereas the first flow control valve 42 is a valve having a flow rate regulating function.

The liquid supply system 30 further includes a cooling-liquid supply pipe 51 and a cooling-liquid discharge pipe 52, both coupled to the pad contact member 11. The cooling-liquid supply pipe 51 is coupled to a cooling-liquid supply source (e.g. a cold water supply source) provided in a factory in which the polishing apparatus is installed. The cooling liquid is supplied to the pad contact member 11 through the cooling-liquid supply pipe 51, flows in the pad contact member 11, and is drained from the pad contact member 11 through the cooling-liquid discharge pipe 52. In one embodiment, the cooling liquid that has flowed through the pad contact member 11 may be returned to the cooling-liquid supply source through the cooling-liquid discharge pipe 52.

A second on-off valve 55 and a second flow control valve 56 are attached to the cooling-liquid supply pipe 51. The second flow control valve 56 is located between the pad contact member 11 and the second on-off valve 55. The second on-off valve 55 is a valve not having a flow rate regulating function, whereas the second flow control valve 56 is a valve having a flow rate regulating function.

Hot water may be used as the heating liquid to be supplied to the pad contact member 11. The hot water is heated to about 80° C., for example, by the heating source 48 in the heating-liquid supply tank 31. When it is intended to raise the surface temperature of the polishing pad 3 more quickly, a silicone oil may be used as the heating liquid. In the case of using the silicone oil as the heating liquid, the silicone oil is heated by the heating source 48 of the liquid supply tank 31 to 100° C. or more (for example, about 120° C.). Cold water or a silicone oil may be used as the cooling liquid to be supplied to the pad contact member 11. In the case of using a silicone oil as the cooling liquid, the polishing pad 3 can be cooled quickly by coupling a chiller as a cooling-liquid supply source to the cooling-liquid supply pipe 51, and by cooling the silicone oil to a temperature of not more than 0° C. Pure water can be used as the cold water. In order to cool pure water to produce cold water, a chiller may be used as a cooling-liquid supply source. In this case, cold water that has flowed through the pad contact member 11 may be returned to the chiller through the cooling-liquid discharge pipe 52.

The heating-liquid supply pipe 32 and the cooling-liquid supply pipe 51 are completely independent pipes. Thus, the heating liquid and the cooling liquid can be simultaneously supplied to the pad contact member 11 without mixing with each other. The heating-liquid return pipe 33 and the cooling-liquid discharge pipe 52 are also completely independent pipes. Thus, the heating liquid is returned to the heating-liquid supply tank 31 without mixing with the cooling liquid, while the cooling liquid is either drained or returned to the cooling-liquid supply source without mixing with the heating liquid.

The pad-temperature regulating system 5 further includes a pad-temperature measuring device 39 for measuring a surface temperature of the polishing pad 3 (which may hereinafter be referred to as pad surface temperature), and the controller 40 operates the first flow control valve 42 and the second flow control valve 56 based on the pad surface temperature measured by the pad-temperature measuring device 39. The first on-off valve 41 and the second on-off valve 55 are usually open.

The pad-temperature measuring device 39 is disposed above the surface of the polishing pad 3, and is configured to measure the surface temperature of the polishing pad 3 in a non-contact manner. The pad-temperature measuring device 39 is coupled to the valve controller 40, and further coupled to a temperature indicator 45 through the controller 40. The pad-temperature measuring device 39 may be an infrared radiation thermometer or thermocouple thermometer which measures the surface temperature of the polishing pad 3, or may be a thermography or thermopile which measures the surface temperature of the polishing pad 3 and obtains the temperature distribution of the polishing pad 3.

In this embodiment, the pad-temperature measuring device 39 is at least one of an infrared radiation thermometer, a thermocouple thermometer, a thermography, and a thermopile. If liquid (slurry, etc.) splattered by polishing of the wafer W adheres to the pad-temperature measuring device 39, the pad-temperature measuring device 39 may not be able to accurately measure the surface temperature of the polishing pad 3. Therefore, the pad-temperature measuring device 39 is located at a sufficiently high position from the surface of the polishing pad 3.

Figure 2:
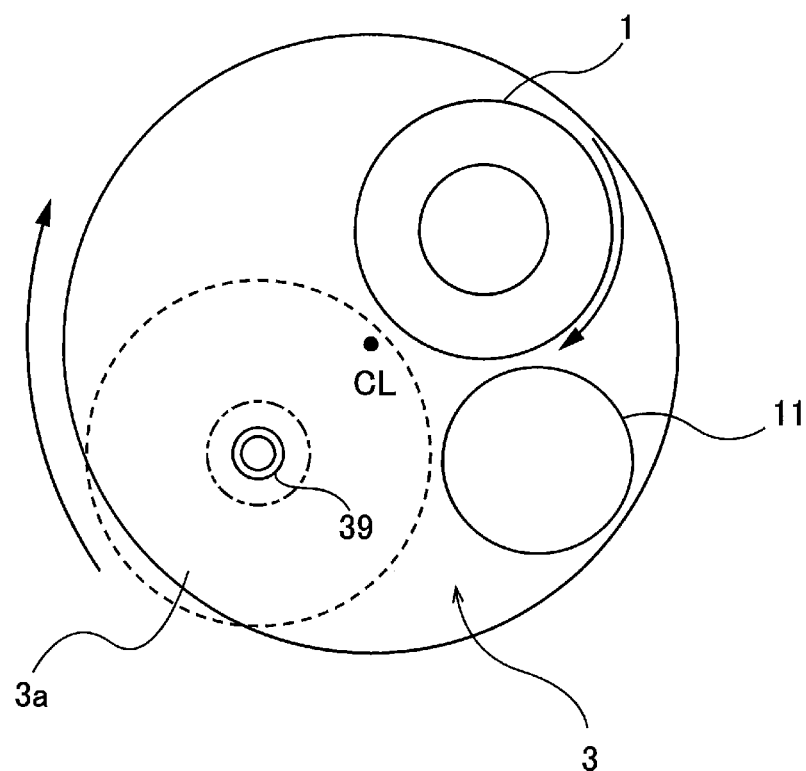
FIG. 2 is a view showing a temperature measurement area of a pad-temperature measuring device viewed from above.
Figure 3:
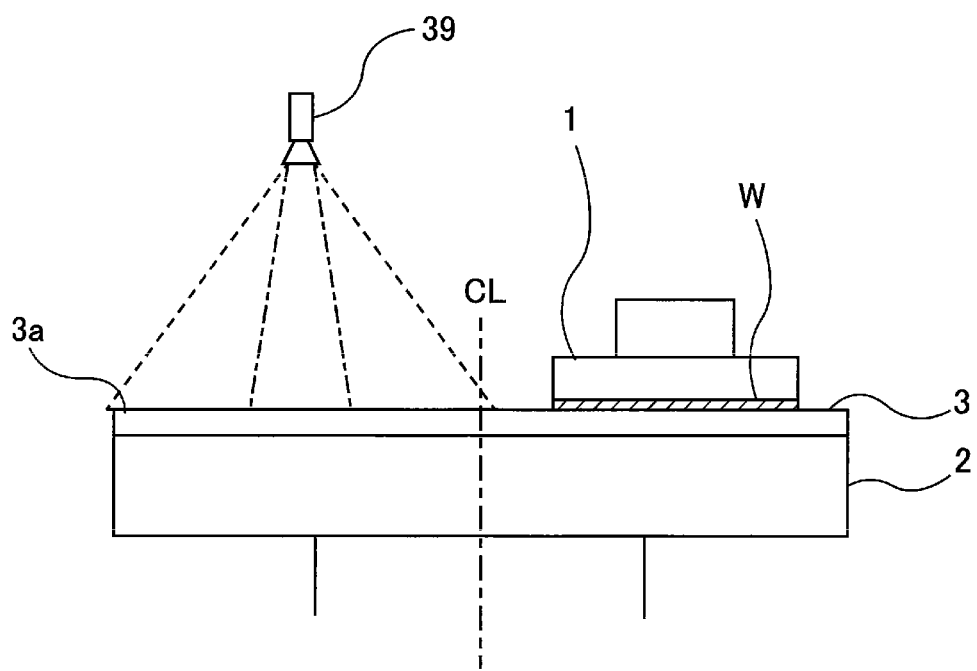
FIG. 3 is a view showing the temperature measurement area of the pad-temperature measuring device viewed from side.

FIG. 2 is a view showing a temperature measurement area of the pad-temperature measuring device 39 viewed from above, and FIG. 3 is a view showing the temperature measurement area of the pad-temperature measuring device 39 viewed from side. When the pad-temperature measuring device 39 is any of the thermocouple thermometer, the thermography, and a thermopile, the pad-temperature measuring device 39 is configured to measure the surface temperature of the polishing pad 3 in an area including a center CL of the polishing pad 3 and a peripheral portion 3a of the polishing pad 3 (see the dotted lines in FIGS. 2 and 3). When the pad temperature measuring instrument 39 is the infrared radiation thermometer, the pad-temperature measuring device 39 is configured to measure the surface temperature of the polishing pad 3 in a part of the area between the center CL of the polishing pad 3 and the peripheral portion 3a of the polishing pad 3 (see the dot-dashed lines in FIGS. 2 and 3). In the case where the pad-temperature measuring device 39 is the infrared radiation thermometer, the polishing unit preferably has a position adjusting mechanism capable of changing a position of the pad-temperature measuring device 39 in a radial direction of the polishing pad 3.

The pad-temperature measuring device 39 measures the pad surface temperature in a non-contact manner, and sends a measured value of the pad surface temperature to the controller 40. The pad-temperature measuring device 39 measures the pad surface temperature at predetermined time intervals (e.g., every 100 ms). The controller 40 operates the first flow control valve 42 and the second flow control valve 56 based on the pad surface temperature measured such that the pad surface temperature reaches a preset target temperature and is subsequently maintained at the target temperature. The first flow control valve 42 and the second flow control valve 56 operate according to control signals from the controller 40, and regulate the flow rates of the heating liquid and the cooling liquid to be supplied to the pad contact member 11. Heat exchange occurs between the polishing pad 3 and the heating liquid and cooling liquid, flowing in the pad contact member 11, whereby the pad surface temperature changes.

Such feedback control can reach the pad surface temperature to the predetermined target temperature, and then maintain the predetermined target temperature. The feedback control is, for example, a PID control. In this embodiment, the controller 40 performs a PID control of manipulated variables of the first flow control valve 42 and the second flow control valve 56 based on the difference between the surface temperature of the polishing pad 3 and the predetermined target temperature. In order to perform this PID control, PID parameters (i.e., proportional gain P, integral gain I, and derivative gain D) are input into the controller 40 in advance.

The manipulated variable for the first flow control valve 42 and the manipulated variable for the second flow control valve 56 are, in other words, the degree of opening of the valve. The manipulated variable for the first flow control valve 42 is proportional to the flow rate of the heating liquid, and the manipulated variable for the second flow control valve 56 is proportional to the flow rate of the cooling liquid. Preferably, the manipulated variable for the first flow control valve 42 is directly proportional to the flow rate of the heating liquid, and the manipulated variable for the second flow control valve 56 is directly proportional to the flow rate of the cooling liquid.

As the controller 40, any control device can be used. For example, a dedicated computer or a general-purpose computer (for example, personal computer) can be used as the controller 40. In one embodiment, the controller 40 may be a PLC (Programmable Logic Controller), or a server. Further, the controller 40 may include a FPGA (Field-Programmable gate array). The target temperature of the polishing pad 3 is determined according to the type of wafer W or the polishing process, and the determined target temperature is input into the controller 40 in advance.

In order to reach and subsequently maintain the pad surface temperature at the predetermined target temperature, the pad contact member 11 is placed in contact with the surface (i.e. the polishing surface) of the polishing pad 3. In this specification, the manner of contact of the pad contact member 11 with the surface of the polishing pad 3 includes not only direct contact of the pad contact member 11 with the surface of the polishing pad 3, but also contact of the pad contact member 11 with the surface of the polishing pad 3 in the presence of a polishing liquid (or slurry) between the pad contact member 11 and the surface of the polishing pad 3. In either case, heat exchange occurs between the polishing pad 3 and the heating liquid and cooling liquid, flowing in the pad contact member 11, whereby the pad surface temperature is controlled.

As shown in FIG. 1, the pad-temperature regulating apparatus 5 further includes an elevating mechanism (vertical movement mechanism) 71, which moves the pad contact member 11 vertically with respect to the surface of the polishing pad 3. The pad contact member 11 is held by the elevating mechanism 71. The elevating mechanism 71 is configured to allow the pad contact member 11 to be moved vertically with respect to the surface of the polishing pad 3. With this configuration, the pad contact member 11 can be directly placed in contact with the surface of the polishing pad 3. The elevating mechanism 71 may be composed of a combination of a servo motor and a ball screw mechanism, or a pneumatic cylinder. Such elevating mechanism 71 enables the pad contact member 11 to be pressed against the surface of the polishing pad 3 with a predetermined pressing force. For example, the pressing force to press the pad contact member 11 against the surface of the polishing pad 3 is regulated to a predetermined pressing force by controlling a pulse signal transmitted to the servomotor, or a pressure of gas supplied to an air cylinder.

The pad contact member 11 is configured to move perpendicularly to the surface of the polishing pad 3 to maintain a constant temperature of an area on the surface of the polishing pad 3 (a radial position of the polishing pad 3). For example, the pad contact member 11 moves perpendicularly to the surface of the polishing pad 3 so as to maintain a temperature on a radial position of the polishing pad 3 where is at a distance of 100 mm from the center CL of the pad 3, at 55° C. User can freely determine (change) the surface temperature of the polishing pad 3 and the radial position of the polishing pad 3 controlled by the pad contact member 11. For example, the user may change the distance from the center CL of the polishing pad 3 from 100 mm to 200 mm as the radial position of the polishing pad 3, and may change the surface temperature of the polishing pad 3 from 55° C. to 70° C. as the surface temperature of the polishing pad 3. As a result, the pad contact member 11 moves vertically with respect to the surface of the polishing pad 3 so as to maintain the temperature of the radial position of the polishing pad 3 where the distance from the center CL of the polishing pad 3 is 200 mm, at 70° C.

Figure 4:
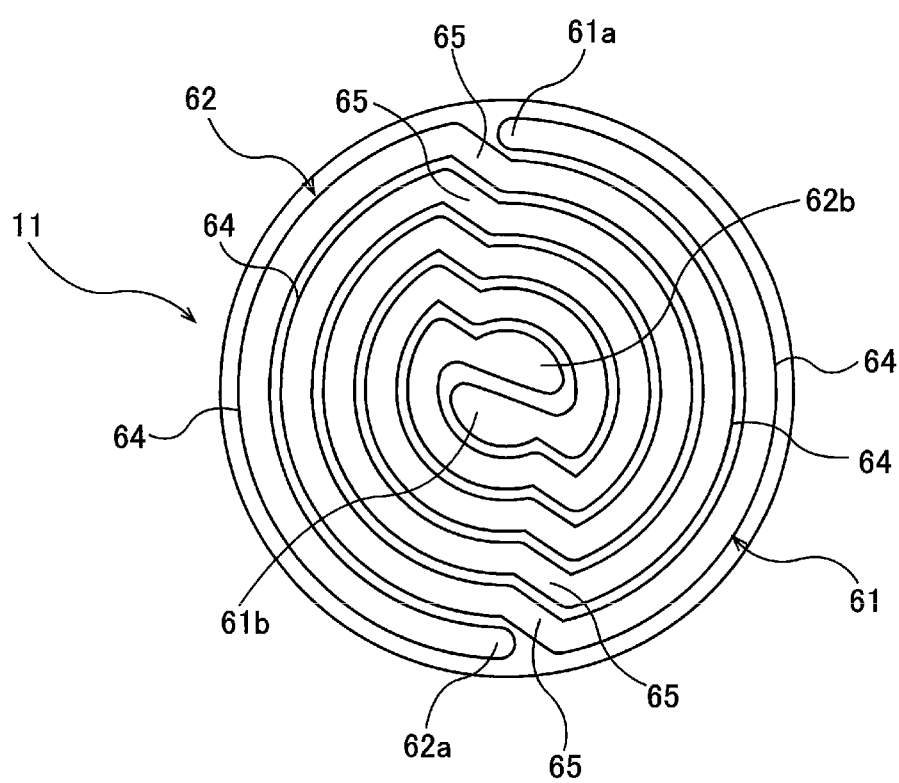
FIG. 4 is a horizontal cross-sectional view showing a pad contact member according to an embodiment.

Next, an example of the pad contact member 11 will be described with reference to FIG. 4. FIG. 4 is a horizontal cross-sectional view showing the pad contact member 11 according to one embodiment. As shown in FIG. 4, the pad contact member 11 has a heating flow passage 61 and a cooling flow passage 62 formed therein. The heating flow passage 61 and the cooling flow passage 62 are arranged next to each other (or side by side), and extend in a spiral shape. Further, the heating flow passage 61 and the cooling flow passage 62 have a shape of point symmetry, and have the same length.

As shown in FIG. 4, Each of the heating flow passage 61 and the cooling flow passage 62 basically comprises a plurality of arc flow passages 64 having a constant curvature and a plurality of inclined flow passages 65 coupling the arc flow passages 64. Two adjacent arc flow passages 64 are coupled by each inclined flow passage 65. Such constructions make it possible to locate the outermost portions of the heating flow passage 61 and the cooling flow passage 62 at an outermost portion of the heat exchanger 11. Specifically, the entire bottom surface of the heat exchanger 11 lies under the heating flow passage 61 and the cooling flow passage 62. Therefore, the heating liquid and the cooling liquid can quickly heat and cool the polishing surface 3a of the polishing pad 3.

The heating-liquid supply pipe 32 is coupled to an inlet 61a of the heating flow passage 61, and the heating-liquid return pipe 33 is coupled to an outlet 61b of the heating flow passage 61. The cooling-liquid supply pipe 51 is coupled to an inlet 62a of the cooling flow passage 62, and the cooling-liquid discharge pipe 52 is coupled to an outlet 62b of the cooling flow passage 62. The inlets 61a and 62a of the heating flow passage 61 and the cooling flow passage 62 are located at the peripheral portion of the pad contact member 11, and the outlets 61b and 62b of the heating flow passage 61 and the cooling flow passage 62 are located at the central portion of the pad contact member 11. Therefore, the heating liquid and the cooling liquid flow spirally from the peripheral portion toward the central portion of the pad contact member 11. The heating flow passage 61 and the cooling flow passage 62 are completely separated, so that the heating liquid and the cooling liquid are not mixed in the pad contact member 11.

Since, as shown in FIG. 1, the heating flow passage 61 and the cooling flow passage 62 are adjacent to each other, the heating flow passage 61 and the cooling flow passage 62 are arranged not only along the radial direction of the polishing pad 3, but also along the circumferential direction of the polishing pad 3. Therefore, while the polishing table 2 and the polishing pad 3 are rotating, the polishing pad 3 performs heat exchange with both of the heating liquid and the cooling liquid.

As shown in FIG. 1, the pad-temperature regulating apparatus 5 may be provided with a heating liquid pump 47 attached to the heating-liquid supply pipe 32. The heating liquid pump 47 is connected to the controller 40, and the controller 40 is configured to be capable of controlling operation of the heating liquid pump 47. For example, the controller 40 can control a rotation speed of the heating liquid pump 47 to regulate a pressure of heating liquid supplied to the pad contact member 11. Furthermore, in the case where the pad-temperature regulating apparatus 5 has the heating liquid pump 47, the first flow control valve 42 attached to the heating-liquid supply pipe 32 may be omitted. The controller 40 can control the rotation speed of the heating liquid pump 47 to regulate the flow rate of heating liquid supplied to the pad contact member 11. In this case, the controller 40 stores in advance a relational expression or a data table showing the relationship between the rotation speed of the heating liquid pump 47 and the flow rate of heating liquid.

Although not shown in the drawings the pad-temperature regulating apparatus 5 may be provided with a cooling liquid pump attached to the cooling-liquid supply pipe 51. In this case, the cooling liquid pump is connected to the controller 40, and the controller 40 is configured to be capable of controlling operation of the cooling liquid pump. For example, the controller 40 can control the rotation speed of the cooling liquid pump to regulate a pressure of cooling liquid supplied to the pad contact member 11. Furthermore, in the case where the pad temperature regulating apparatus 5 has a cooling liquid pump, the second flow control valve 56 attached to the cooling-liquid supply pipe 51 may be omitted. The controller 40 can control the rotation speed of the cooling liquid pump to regulate the flow rate of cooling liquid supplied to the pad contact member 11. In this case, the controller 40 stores in advance a relational expression or a data table showing a relationship between the rotation speed of the cooling liquid pump and the flow rate of cooling liquid.

The polishing apparatus includes at least one polishing unit described above. In a case where the polishing apparatus includes a plurality of polishing units, the controller 40 described above serves as a common controller among the plurality of polishing units. More specifically, the controller 40 is configured to control operations of each polishing unit and operations of the pad-temperature regulating apparatus 5 provided in each polishing unit. Further, in factories for semiconductor devices, a plurality of polishing apparatus are often installed Specifically, in such factories, a plurality of polishing apparatuses each of which has a plurality of polishing units are installed.

Figure 5:
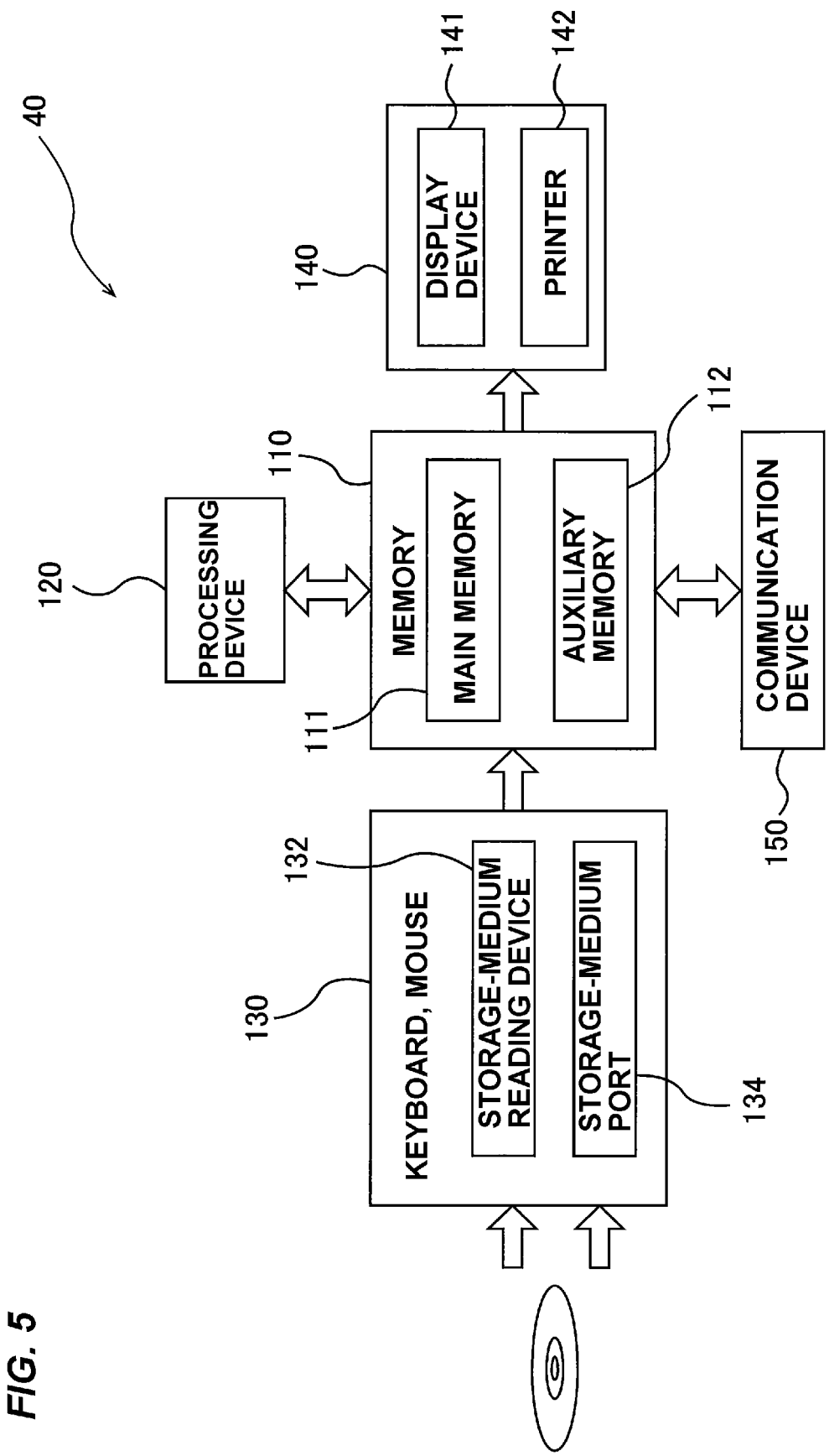
FIG. 5 is a schematic view showing a controller according to one embodiment.

FIG. 5 is a schematic view showing the controller 40 according to one embodiment. The controller 40 shown in FIG. 5 is a dedicated or general-purpose computer (for example, personal computer). In one embodiment, the controller 40 may be a PLC (Programmable Logic Controller), or may be a server. Further, the controller 40 may include a FPGA (Field-Programmable gate array). The controller shown in FIG. 5 includes a memory 110 in which a program and data are stored, a processing device 120, such as CPU (central processing unit) or GPU (graphics processing unit), for performing arithmetic operation according to the program stored in the memory 110, an input device 130 for inputting the data, the program, and various information into the memory 110, an output device 140 for outputting processing results and processed data, and a communication device 150 for connecting to a network, such as the Internet.

The memory 110 includes a main memory 111 which is accessible by the processing device 120, and an auxiliary memory 112 that stores the data and the program therein. The main memory 111 may be a random-access memory (RAM), and the auxiliary memory 112 is a storage device which may be a hard disk drive (HDD) or a solid-state drive (SSD).

The input device 130 includes a keyboard and a mouse, and further includes a storage-medium reading device 132 for reading the data from a storage medium, and a storage-medium port 134 to which a storage medium can be connected. The storage medium is a non-transitory tangible computer-readable storage medium. Examples of the storage medium include optical disk (e.g., CD-ROM, DVD-ROM) and semiconductor memory (e.g., USB flash drive, memory card). Examples of the storage-medium reading device 132 include optical drive (e.g., CD drive, DVD drive) and card reader. Examples of the storage-medium port 134 include USB terminal. The program and/or the data stored in the storage medium is introduced into the computer via the input device 130, and is stored in the auxiliary memory 112 of the memory 110. The output device 140 includes a display device 141 and a printer 142.

Figure 19:
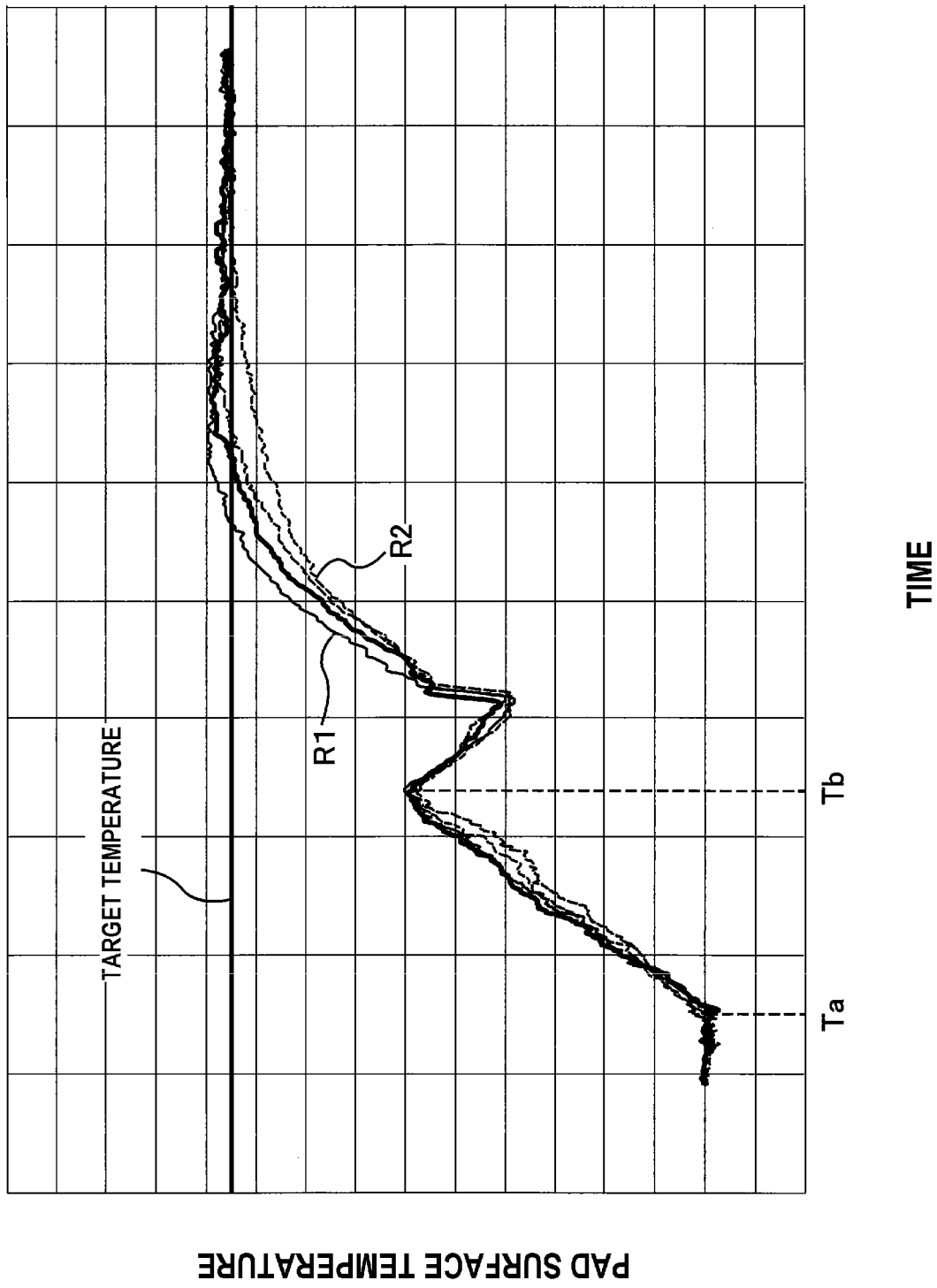
FIG. 19 is a graph showing temperature behaviors in each of four polishing units.

As described with reference to FIG. 19, variations in temperature behavior occur due to machine differences between each polishing unit. In this embodiment, in order to suppress such variations in temperature behavior, the processing device 120 of the controller 40 is configured to create a temperature behavior curve until the temperature of the polishing pad 3 reaches a predetermined target temperature based on measured values of the pad-temperature measuring device 39 and measurement time points thereof, and change at least one of the temperature behavior parameters such that a temperature behavior curve when a next wafer W is polished is maintained within a predetermined allowable range. The temperature behavior curve is created each time the wafer W is polished, and the processing device 120 of the controller 40 stores a plurality of temperature behavior curves in the memory 110. The temperature behavior curve and the predetermined allowable range will be described below with reference to FIGS. 6 and 7.

Figure 6:
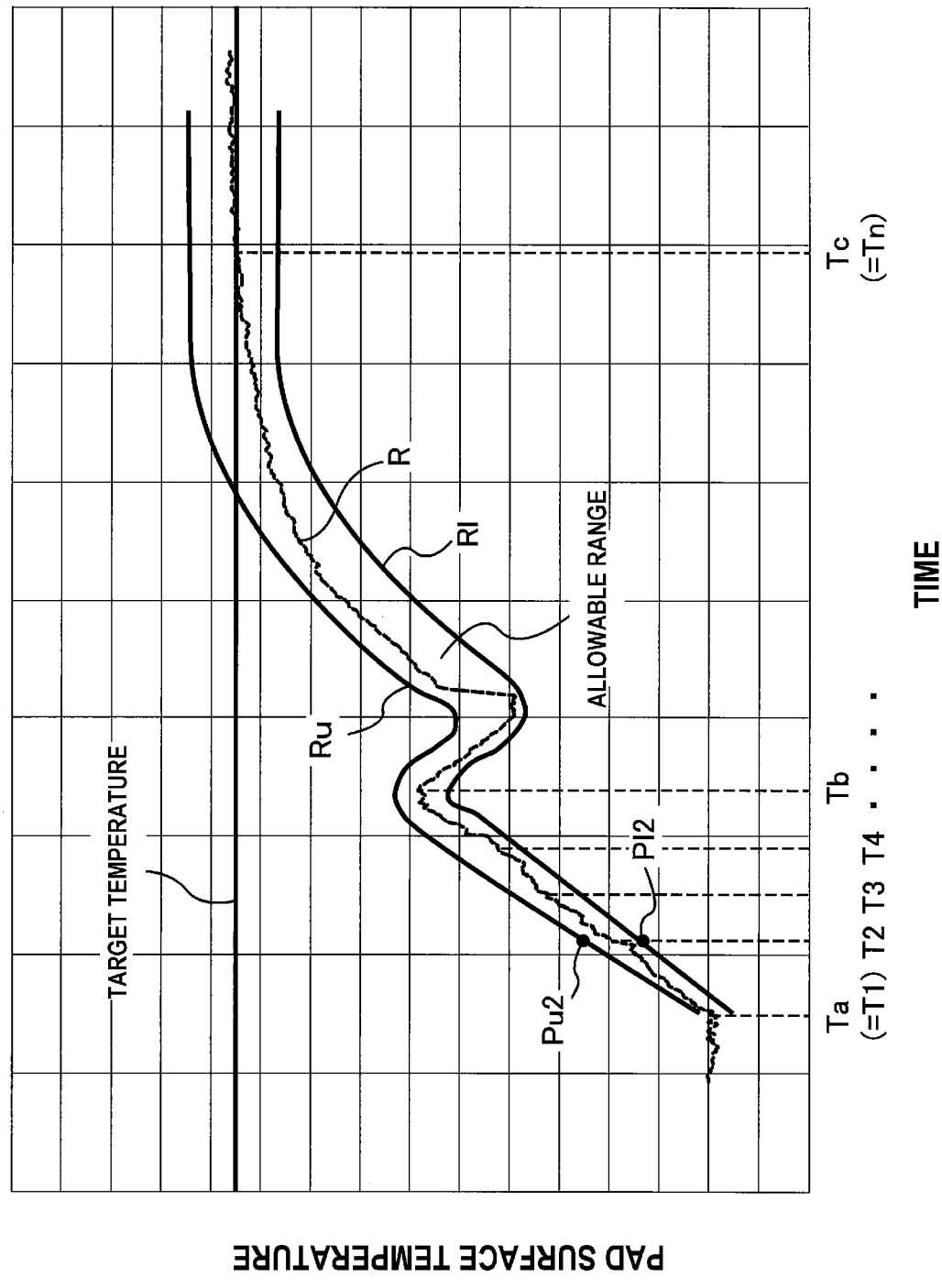
FIG. 6 is a graph showing an example of the temperature behavior curve created by the controller.
Figure 7:
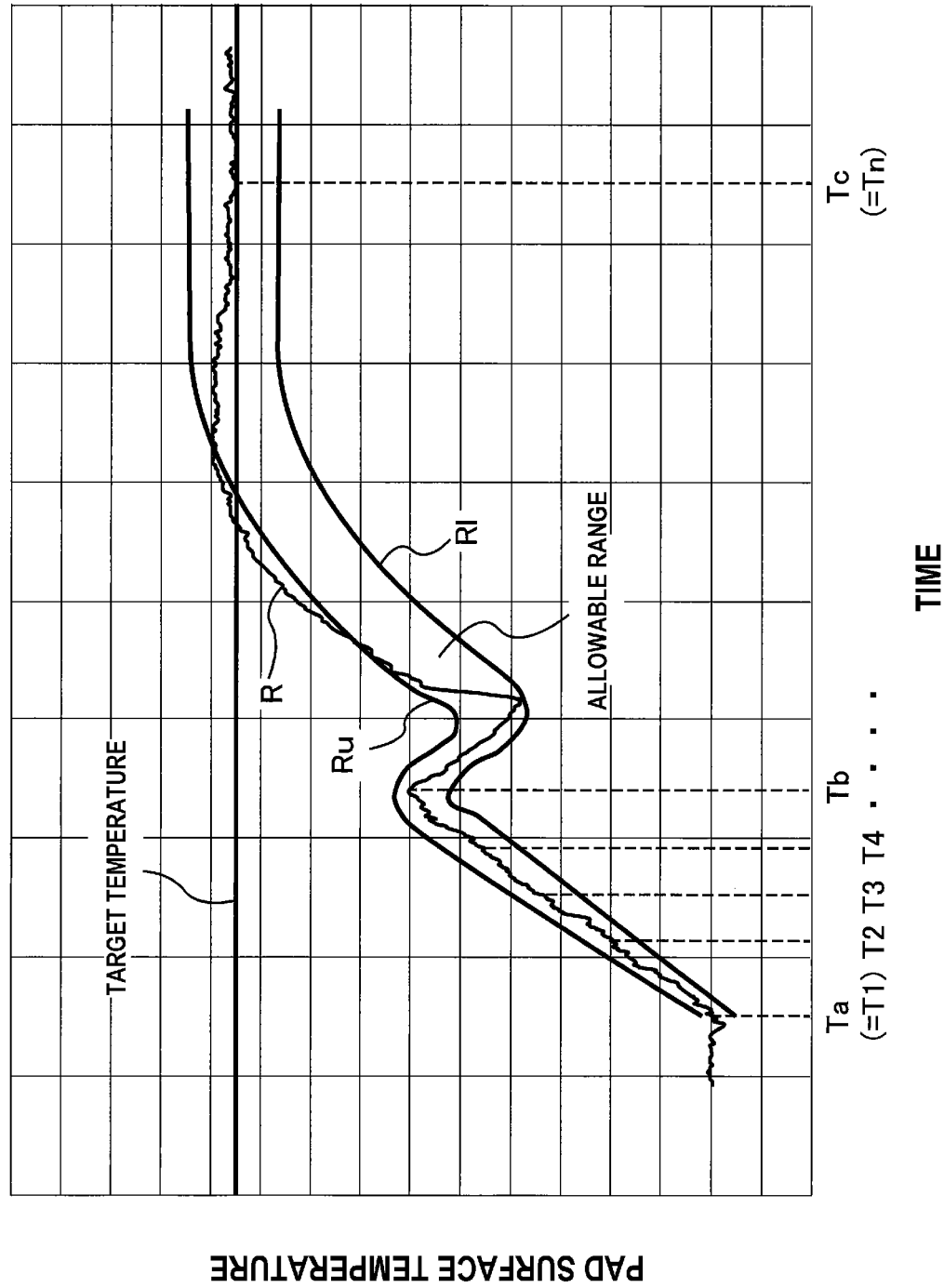
FIG. 7 is another example of the temperature behavior curve created by the controller.

FIG. 6 is a graph showing an example of the temperature behavior curve, and FIG. 7 is another example of the temperature behavior curve. FIG. 6 is a graph showing an example in which the temperature behavior curve is within the allowable range described below, and FIG. 7 is a graph showing an example in which the temperature behavior curve is out of the allowable range. In FIGS. 6 and 7, the vertical axis represents the surface temperature of the polishing pad 3 (pad surface temperature), and the horizontal axis represents time.

As shown in FIG. 7, while the pad-temperature regulating apparatus 5 converges the pad surface temperature to the target temperature, the pad surface temperature may once exceed the target temperature. This phenomenon is known as "overshoot". In this specification, a concept of "the surface temperature of the polishing pad 3 (pad surface temperature) has reached the target temperature" includes this overshoot. More specifically, when the overshoot occurs, a time point when the pad surface temperature once reaches the target temperature is not determined as the time point when the pad surface temperature reaches the target temperature, while a time point when the pad surface temperature converges to the target temperature after overshooting is determined as the time point when the pad surface temperature reaches the target temperature.

As described above, first, the controller 40 instructs the elevating mechanism 71 to place the pad contact member 11 into contact with the surface of the polishing pad 3, and thus starts regulating of the pad surface temperature. As a result, the surface temperature of the polishing pad 3 begins to increase. A time point Ta in FIGS. 6 and 7 corresponds to a time point when the pad contact member 11 contacts the surface of the polishing pad 3, i.e., the time point when the pad contact member 11 starts regulating of the pad surface temperature. Next, the controller 40 instructs the polishing head 1 to press the surface of the wafer W, held by the polishing head 1, against the polishing pad 3, so that polishing of the wafer (substrate) W is started. A time point Tb in FIGS. 6 and 7 corresponds to a time point when the wafer W contacts the surface of the polishing pad 3 (polishing surface), i.e., the time point when polishing of the wafer W has started. As shown in FIGS. 6 and 7, when the wafer W at room temperature is placed into contact with the surface of the polishing pad 3 after regulating of the pad surface temperature has started, the pad surface temperature temporarily decreases.

The controller 40 at least controls the flow rates of the heating liquid and the cooling liquid flowing through the heating flow passage 61 and the cooling flow passage 62, respectively, of the pad contact member 11 to reach the pad surface temperature to the predetermined target temperature. A time point Tc in FIGS. 6 and 7 corresponds to a time point when the pad surface temperature reaches the predetermined target temperature. Thereafter, the controller 40 at least controls the flow rates of the heating liquid and the cooling liquid flowing through the heating flow passage 61 and the cooling flow passage 62 of the pad contact member 11, respectively, so as to maintain the pad surface temperature to the target temperature.

A temperature behavior curve R is a curve that represents a temporal change (i.e., temperature behavior) in the pad surface temperature from the time point Ta when the pad contact member 11 starts regulating of the pad surface temperature to the time point Tc when the target temperature is reached. The controller 40 creates the temperature behavior curve R based on the measured values of pad surface temperature sent from the pad-temperature measuring device 39 and the measurement time points thereof, and stores this temperature behavior curve R.

The pad-temperature measuring device 39 measures the pad surface temperature at predetermined time intervals (e.g., every 100 ms), and the measured values of pad surface temperature are sequentially sent to the controller 40. Every time the measured values of the pad surface temperature and the measurement time point thereof are sent from the pad-temperature measuring device 39, the controller 40 plots the measured values sequentially on a graph as shown in FIG. 6, and connects the plurality of plot points with a smooth curve at the time point Tc when the surface temperature of the polishing pad 3 reaches the target temperature. This allows the controller 40 to obtain the temperature behavior curve R.

In FIGS. 6 and 7, the allowable range is an area sandwiched between an upper limit curve Ru, which defines an upper limit of the allowable range, and the lower limit curve Rl, which defines the lower limit of the allowable range. This allowable range corresponds to a range in which the variation of the temperature behavior curve R is allowed. When at least a part of the temperature behavior curve R is out of the allowable range (see FIG. 7), the controller 40 determines that the temperature behavior curve R is out of the allowable range. For example, the allowable range can be determined in advance by experiments performed by the manufacturer of the polishing apparatus. This allowable range is commonly used for each polishing unit.

Alternatively, the allowable range may be produced from a plurality of temperature behavior curves obtained when a predetermined number (e.g., 100) of wafers W is polished. An example of a method for producing the allowable range from the plurality of temperature behavior curves is described below.

As shown in FIGS. 6 and 7, the pad-temperature measuring device 39 measures the pad surface temperature at each predetermined time interval (i.e., at each of measurement time point T1, T2, T3, T4, ... Tn), and the measured values of pad surface temperature are sent to the controller 40 at each of the predetermined time intervals. The first measurement time point T1 corresponds to the time point Ta described above, and the measurement time point Tn corresponds to the time point Tc described above. In this embodiment, the time point Tb when polishing of the wafer W is started is between the measurement time point T1 (=Ta) and the measurement time point Tn (=Tc). In FIGS. 6 and 7, the intervals between adjacent measurement time points are enlarged in order to avoid clutter in the drawings. The actual interval between adjacent measurement time points is narrower than that shown in FIGS. 6 and 7, and is for example 100 ms.

The controller 40 stores the plurality of measured values of pad surface temperature from the time point Ta (=T1) to the time point Tc (=Tn) in association with the measurement time points T1, T2, T3, T4, ... Tn. Furthermore, the controller 40 performs this operation every time a predetermined number of wafers W is polished. As a result, the controller 40 stores a plurality of data sets of the measured values of pad surface temperature, which are associated with the same measurement time points T1, T2, ... Tn. FIG. 8 is a schematic view showing an example of the plurality of data sets. When producing the plurality of data sets shown in FIG. 8, it is preferable to exclude combinations of the measured values of pad surface temperature and the measurement time points thereof constituting the temperature behavior curves (see FIG. 7) that are out of the allowable range. In other words, the plurality of data sets shown in FIG. 8 are preferably constituted only of combinations of the measured values of pad surface temperature and the measurement time points thereof constituting the temperature behavior curves (see FIG. 6) that are within the allowable range.

Figure 9:
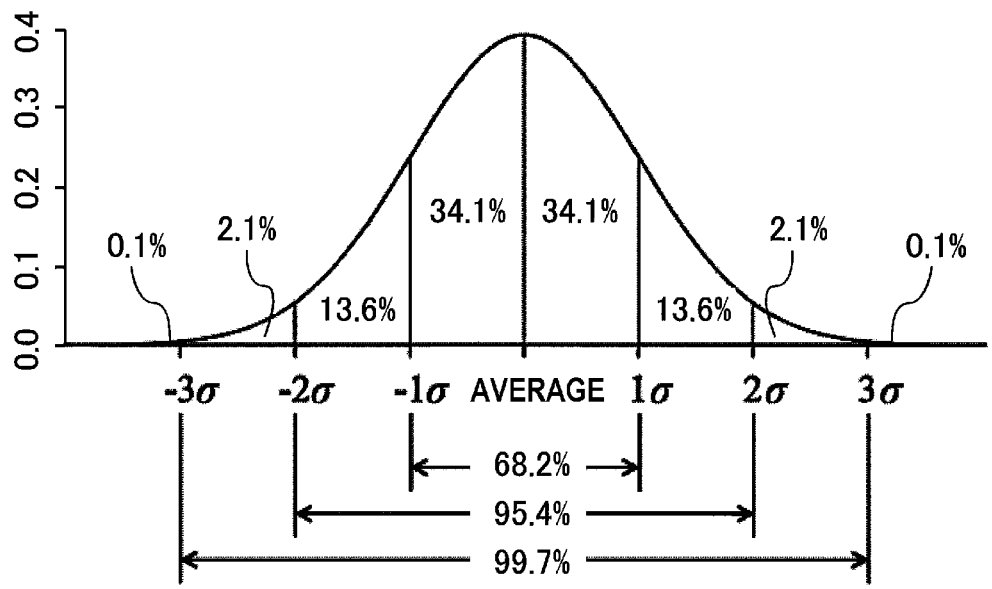
FIG. 9 is a view showing a normal distribution produced based on data set D2 at a measurement time point T2 shown in FIG. 8.

Next, the controller 40 produces a normal distribution of each data set. FIG. 9 is a view showing the normal distribution produced based on data set D2 at the measurement time point T2 shown in FIG. 8. The controller 40 extracts one plot point of the upper limit curve Ru based on the normal distribution as shown in FIG. 9. For example, a value of the pad surface temperature corresponding to $2\sigma$ of the normal distribution shown in FIG. 9 is extracted as one plot point Pu2 (see FIG. 6) for constituting the upper limit curve Ru. The controller 40 repeats this operation with the data sets corresponding to all the measurement time points T1, T2, ... Tn to thereby obtain a plurality of plot points Pu1, Pu2, ... Pun for forming m the upper limit curve Ru. By connecting these plot points Pu1, Pu2, ... Pun with a smooth curve, the upper limit curve Ru is obtained. Note that only the plot point Pu2 is depicted in FIG. 6 as a representative of the plot points forming the upper limit curve Ru.

Similarly, a value of the pad surface temperature corresponding to $-2\sigma$ of the normal distribution shown in FIG. 9 is extracted as one plot point Pl2 (see FIG. 6) for constituting the lower limit curve Rl. The controller 40 repeats this operation with the data sets corresponding to all the measurement time points T1, T2, ... Tn to thereby obtain a plurality of plot points Pl1, Pl2, ... Pln for forming the lower limit curve Rl. By connecting these plot points with a smooth curve, the lower limit curve Rl is obtained. Note that only plot point Pl2 is depicted in FIG. 6 as a representative of the plot points forming the lower limit curve Rl. The allowable range obtained in this manner corresponds to the range of ±2σ of the average of the plurality of temperature behavior curves obtained when the predetermined number of wafers W is polished.

Another example of the method for producing the allowable range from the plurality of temperature behavior curves obtained when polishing a predetermined number (e.g., 100) of wafers is to select a reference temperature behavior curve from the plurality of temperature behavior curves. The reference temperature curve is, for example, the temperature behavior curve that is most located at the center when the plurality of temperature behavior curves is drawn on the same graph. The allowable range is defined by the upper limit curve Ru and the lower limit curve R1, which are separated from the reference temperature curve by a predetermined ratio in the vertical direction. More specifically, the upper limit curve Ru, which defines the upper limit of allowable range, is obtained by multiplying each value of pad surface temperatures constituting the selected reference temperature behavior curve by a predetermined coefficient (+C %), which is a positive number, and connecting the obtained values with a smooth curve. The lower limit curve R1, which defines the lower limit of allowable range, is obtained by multiplying each value of pad surface temperatures constituting the selected reference temperature behavior curve by a predetermined coefficient (−C %), which is a negative number, and connecting the obtained values with a smooth curve. In this case, the allowable range is defined by the upper limit curve Ru and the lower limit curve R1, which are separated from the reference temperature curve by ±C % in the vertical direction. Typically, a As for the value of C, which is a predetermined ratio, a value in the range of 5 to 20 is used.

If the temperature behavior curve R is deviated from the predetermined allowable range as shown in FIG. 7, a yield of products (i.e., semiconductor devices) may be adversely affected. Therefore, it is preferable that the temperature behavior curve R is always within the predetermined allowable range. One example of a method for maintaining the temperature behavior curve R within the predetermined allowable range is to change at least one of temperature behavior parameters used when polishing the next wafer W, if the temperature behavior curve R that has been created when polishing the wafer W is deviated from the predetermined allowable range. The temperature behavior parameters to be changed and the change values thereof can be determined, for example, by experiments performed by the manufacturer of the polishing apparatus.

However, in this embodiment, in order to maintain the temperature behavior curve R within the predetermined allowable range, the controller 40 uses artificial intelligence (AI) to predict the temperature behavior parameters to be changed and the change values thereof.

In this specification, the temperature behavior parameter is a generic term for parameters capable of changing the temperature behavior described above. Typical examples of temperature behavior parameters are included as follows.

1) flow rate of heating liquid
2) flow rate of cooling liquid
3) PID parameters for determining the manipulated variables for the first flow control valve 42 and the second flow control valve 56
4) rotation speed of the heating liquid pump
5) rotation speed of the cooling liquid pump
6) supply pressure of the heating liquid
7) supply pressure of the cooling liquid
8) temperature of the heating liquid
9) temperature of the cooling liquid
10) set temperature of the heating source 48
11) temperature of the polishing liquid
12) flow rate of the polishing liquid
13) dropping position of the polishing liquid
14) rotation speed of the polishing head 1
15) rotation speed of the polishing table 2
16) polishing load of the wafer W to the polishing pad 3
17) pressing load of the pad contact member 11 against the polishing pad 3
18) dressing conditions
19) temperature of atmosphere in the polishing unit
20) position of the pad-temperature measuring device 39 in the radial direction of the polishing pad 3
21) time The time described in the item 21) means a time when the controller 40 has acquired the temperature behavior parameters described in the items 1) to 20), and is a value associated with the temperature behavior parameters described in the items 1) to 20). Here, in order to regulate the temperature of the polishing pad 3 by changing the temperature behavior parameter, it is necessary to monitor the temperature behavior parameter that changes from time to time. Therefore, The acquisition time of temperature behavior parameters is a very important factor in performing accurate temperature control. Thus, in this specification, the temperature behavior parameter is defined to include "time".

The temperature behavior (i.e., temperature behavior curve) can be changed by changing at least one of the temperature behavior parameters described in the items 1) to 20). For example, when the flow rate and/or the temperature of heating liquid is increased or the flow rate and/or the temperature of cooling liquid is decreased, the surface temperature of the polishing pad 3 is increased more quickly. Changing the PID parameters causes the manipulated variables for the first flow control valve 42 and the second flow control valve 56 to be changed, resulting in a change in the flow rate of the heating liquid and the flow rate of the cooling liquid. In particular, the change in the proportional gain P of the PID parameters has a significant effect on the change in temperature behavior.

In the case where the heating liquid pump 47 (see FIG. 1) is attached to the heating-liquid supply pipe 32, changing the rotation speed of the heating liquid pump 47 enables the flow rate and the supply pressure of the heating liquid to be changed. Similarly, in the case where the cooling liquid pump (not shown) is attached to the cooling-liquid supply pipe 51, changing the rotation speed of the cooling liquid pump enables the flow rate and the supply pressure of the cooling liquid to be changed. Therefore, changing the rotation speed of the heating liquid pump 47 and/or the cooling liquid pump enables the temperature behavior to be changed.

Further, the controller 40 may change the set temperature of the heating source (e.g., heater) 48 located in the heating-liquid supply tank 31. With this operation, the temperature of the heating liquid supplied to the pad contact member 11 can be changed, thus enabling the temperature behavior to be changed.

The polishing liquid (slurry) supplied onto the polishing pad 3 causes the pad surface temperature that has been increased by the pad contact member 11 to be decreased. Therefore, changing the temperature and/or the flow rate of the polishing liquid causes the amount of decrease in the pad surface temperature to be changed, resulting in a change in temperature behavior. For the same reason, the temperature behavior can be changed by changing the dropping position of the polishing liquid.

When the wafer W held by the rotating polishing head 1 is pressed against the polishing pad 3 supported by the rotating polishing table 2, frictional heat is generated between the wafer W and the polishing pad 3, and this frictional heat causes the pad surface temperature to be increased. The amount of this frictional heat varies depending on the rotation speed of the polishing head 1, the rotation speed of the polishing table 2, and the polishing load of the wafer W against the polishing pad 3. Therefore, changing the rotational speed of the polishing head 1, the rotational speed of the polishing table 2, and/or the polishing load enables the temperature behavior to be changed.

Furthermore, when the pad contact member 11 is pressed against the surface of the rotating polishing pad 3 by the elevating mechanism 11, frictional heat is generated between the pad contact member 11 and the polishing pad 3, and this frictional heat also causes the pad surface temperature to be increased. The amount of this frictional heat varies depending on the pressing load of the pad contact member 11 against the polishing pad 3. Therefore, changing the pressing load with which the elevating mechanism 11 presses the pad contact member 11 against the surface of the polishing pad 3 enable the temperature behavior to be changed.

The dresser 20 dresses the surface of the polishing pad 3 according to the preset dressing conditions. These dressing conditions include, for example, the rotation speed of the dresser 20, and the pressing load of the dresser 20 against the polishing pad 3. Changing the dressing conditions results in a change in a roughness of the surface of the polishing pad 3 after being dressed by the dresser 20. As a result, since the amount of frictional heat generated between the wafer W and the polishing pad 3 during polishing, and the amount of frictional heat generated between the pad contact member 11 and the polishing pad 3 are changed, changing the dressing conditions enables the temperature behavior to be changed.

A temperature of atmosphere in the polishing unit also affects the temperature behavior, and thus is one of the temperature behavior parameters. For example, a slope of the temperature behavior curve for a polishing unit with a temperature of atmosphere of 20° C. is smaller than a slope of the temperature behavior curve for a polishing unit with a temperature of atmosphere of 25° C.

As described above, when the pad-temperature measuring device 39 is an infrared radiation thermometer, a position of the pad-temperature measuring device 39 in a radial direction of the polishing pad 3 can be adjusted. Changing the position of the pad-temperature measuring device 39 in the radial direction of the polishing pad 3 causes a measurement area of the pad-temperature measuring device 39 in the polishing pad 3 to be changed. Therefore, the measured value of the pad-temperature measuring device 39 is changed before and after changing of the position. Since the controller 40 controls the first flow control valve 42 and the second flow control valve 56 based on the pad surface temperature measured, changing the position of the pad-temperature measuring device 39 in the radial direction of the polishing pad 3 enables the temperature behavior to be changed.

Figure 10:
FIG. 10 is a schematic view showing an example of configuration of an artificial intelligence installed in the controller shown in FIG. 5.

FIG. 10 is a schematic view showing an example of configuration of the artificial intelligence installed in the controller 40 shown in FIG. 5. In the artificial intelligence shown in FIG. 10, machine learning using a neural network or quantum computing is performed to construct a learned model for maintaining the temperature behavior curve R within a predetermined allowable range. Typically, the learned model is constructed to output prediction or diagnostic results for the input data. For example, when at least one temperature behavior parameter is input to the learned model, the learned model predicts and outputs the at least one temperature behavior parameter to be changed and the change value thereof in order to maintain the temperature behavior curve R within the predetermined allowable range.

Figure 11:
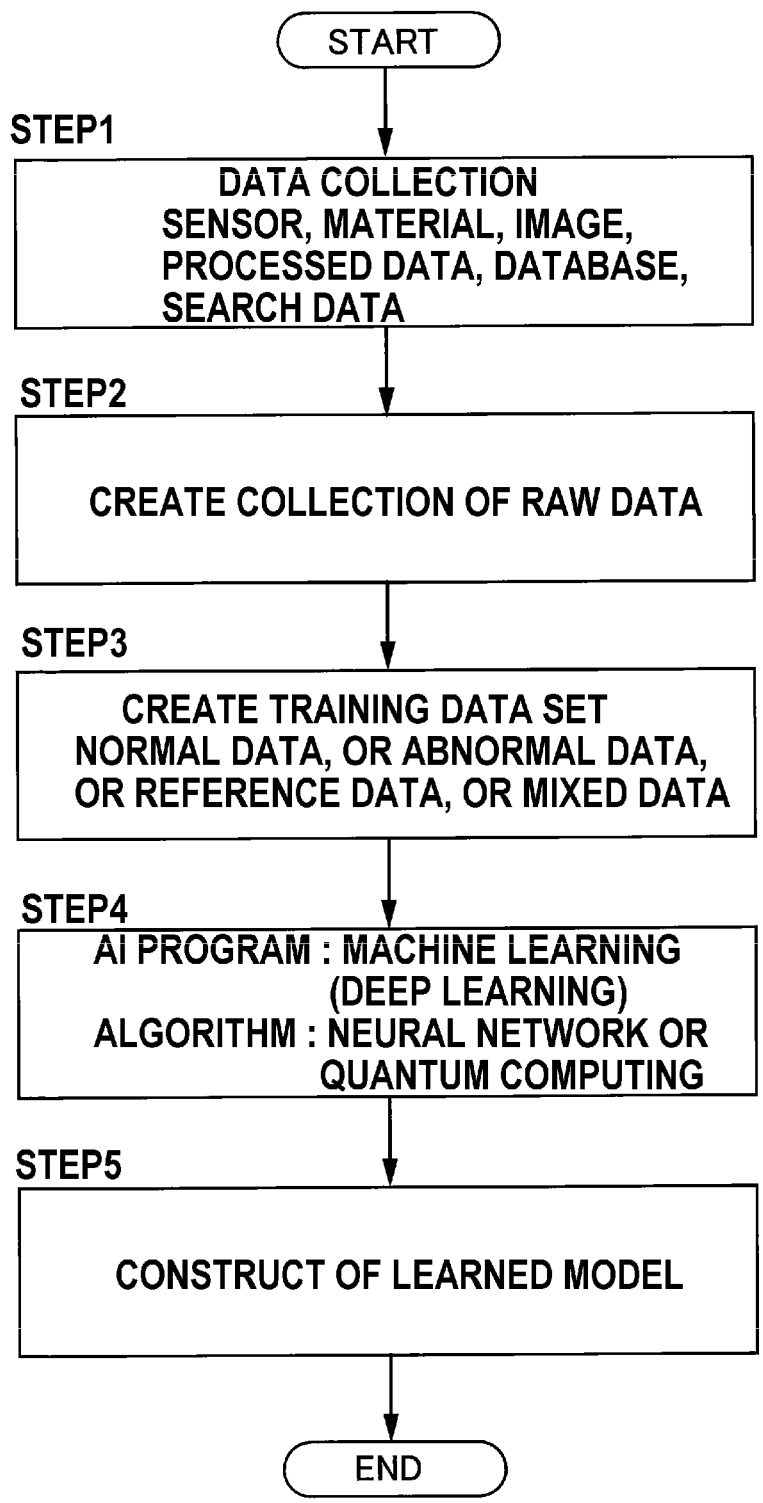
FIG. 11 is a flowchart to illustrate a method for constructing a learned model shown in FIG. 10.

FIG. 11 is a flowchart to illustrate a method for constructing the learned model shown in FIG. 10. In constructing the learned model, data collection is first performed (see Step 1), and a collection of raw data is created (see Step 2). The data collection performed in step 1 is extensive. For example, the data to be collected includes measured values of various sensors arranged in the polishing apparatus, materials of each component arranged in the polishing apparatus, and parameters entered into the polishing apparatus by the operator. If an imaging device is arranged in the polishing apparatus, image data acquired by the imaging device is also included. Further, the data to be collected may include processed data that is processed from measured values of sensors, image data, and the like, as well as a database that stores various data of the polishing apparatus and search data. The collection of these raw data may be referred to as "big data".

Next, a training data set necessary for constructing the learned model is created from the collection of raw data (see Step 3). The training data set is a data set necessary for constructing the learned model to maintain the temperature behavior curve R within the predetermined allowable range, and is also referred to as "teacher data". This training data set can be normal data, abnormal data, reference data, or mixed data. Mixed data means a data set in which normal data and abnormal data are mixed in a predetermined proportion. For example, mixed data may be composed of 80% normal data and 20% abnormal data, or 90% normal data and 10% abnormal data. Typically, mixed data contains more normal data than abnormal data, and the ratio of normal data suitable to use mixed data created by selecting the ratio of normal data from the range of 70-100% and the ratio of abnormal data from the range of 0-30% so that the total of the ratio of normal data and the ratio of abnormal data is 100%.

The training data set includes, for example, at least one temperature behavior parameter. As described above, the temperature behavior parameters include the flow rate of heating liquid, the flow rate of cooling liquid, the PID parameters for determining the manipulated variables for the first flow control valve 42 and the second flow control valve 56, the rotation speed of the heating liquid pump, the rotation speed of the cooling liquid pump, the supply pressure of the heating liquid, the supply pressure of the cooling liquid, the temperature of the heating liquid, the temperature of the cooling liquid, the set temperature of the heating source 48, the temperature of the polishing liquid, the flow rate of the polishing liquid, the dropping position of the polishing liquid, the rotation speed of the polishing head 1, the rotation speed of the polishing table 2, the polishing load of the wafer W to the polishing pad 3, the pressing load of the pad contact member 11 against the polishing pad 3, the dressing conditions, the temperature of atmosphere in the polishing unit, the position of the infrared radiation thermometer in the radial direction of the polishing pad 3, and time. The learning data set may be stored in advance in the memory 110 of the controller 40, or provided to the controller 40 through the communication device 150. Further, the learning data set may include the plurality of temperature behavior curves stored in the memory 110, and may further include the combinations of the measured values of the pad-temperature measuring device 39 and the measurement time points thereof, which have been used in creating each temperature behavior curve.

Next, the machine learning using neural network or quantum computing is performed (see Step 4) to construct the learned model to maintain the temperature behavior curve R within the predetermined allowable range (see Step 5). The machine learning for constructing the learned model includes learning using normal data as the training data set, learning using abnormal data as the training data set, learning using reference data as the training data set, and learning using mixed data as the training data set. The machine learning for constructing the learned model may include also leanings different from the above learning. For example, the learned model may be constructed by learning without using the training data set (i.e., learning without "teacher data"), or by performing reinforcement learning.

As the machine learning using neural network or quantum computing, a deep learning method is preferably used. The deep learning method is a neural-network-based learning method, and in the neural network, hidden layers (also referred to middle layers) are multilayered. In the present specification, a machine learning using a neural network constructed of an input layer, two or more hidden layers, and an output layer is referred to as deep learning.

Figure 12:
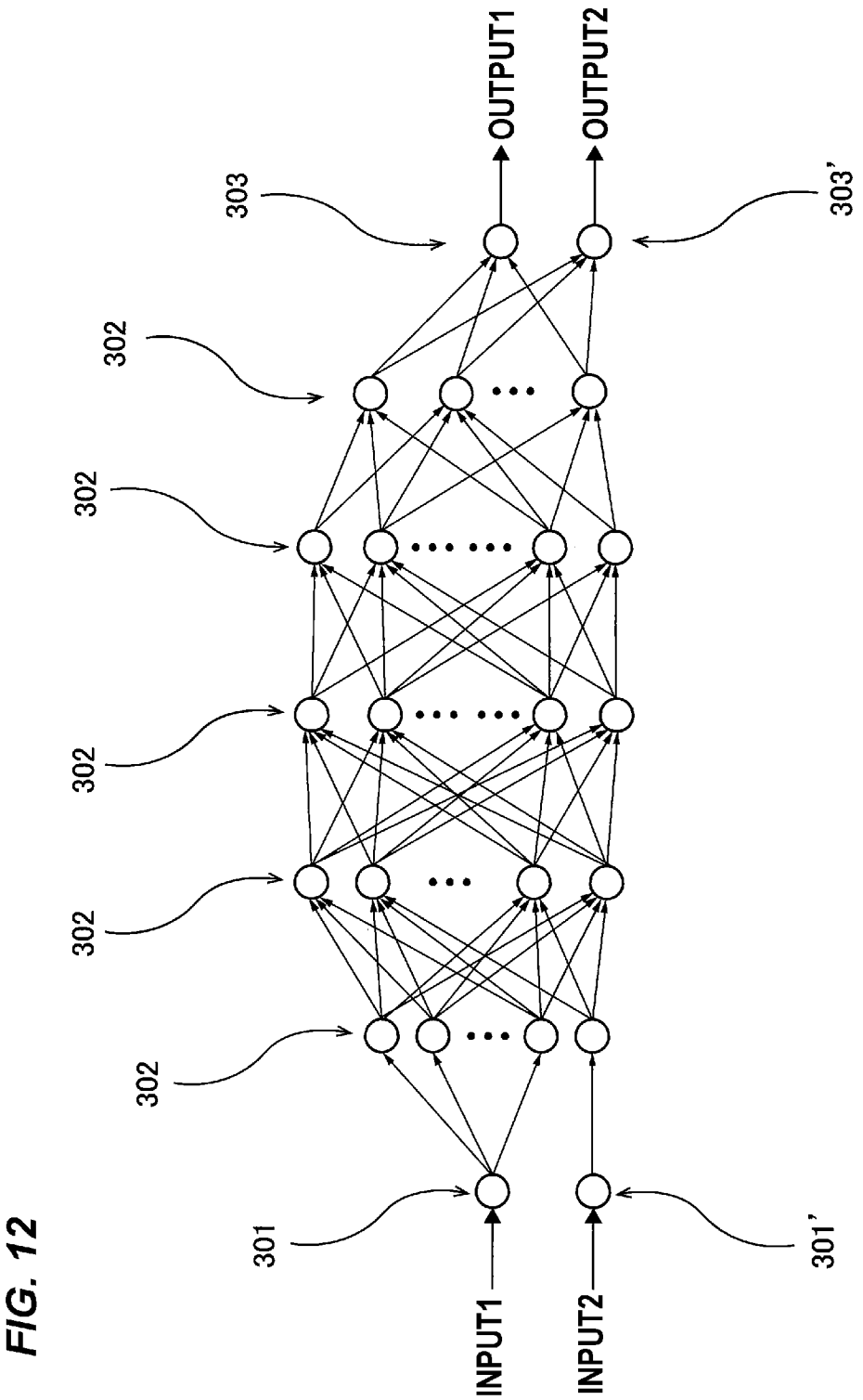
FIG. 12 is a schematic view showing an example of structure of neural network.

FIG. 12 is a schematic view showing an example of structure of neural network. The learned model is constructed by the deep learning method using the neural network as shown in FIG. 12.

The neural network shown in FIG. 12 includes an input layer 301, a plurality of hidden layers (five hidden layers in the illustrated example) 302, and an output layer 303. When normal data is used as the training data set, the controller 40 adjusts weight parameters for constructing the neural network by use of the normal data to construct the learned model. More specifically, the controller 40 adjusts the weight parameters of the neural network such that, when data including at least one temperature behavior parameter that have been prepared for learning, is inputted into the input layer 301 of the neural network, data corresponding to the temperature behavior parameter(s) to be changed, and the change value(s) thereof in order to maintain the temperature behavior curve within the predetermined allowable range are outputted from the output layer 303 of the neural network. For example, the weight parameters of the neural network are adjusted, such that, when data including at least one temperature behavior parameter is input to the input layer 301 of the neural network, the PID parameter(s) to be changed, and the changed value(s) of the PID parameter to maintain the temperature behavior curve within the predetermined allowable range is output from the output layer 303 of the neural network.

The change value of the PID parameter output from the output layer 303 is compared with the normal range, which is the collection of PID parameters when the temperature behavior curves have been within the predetermined allowable range. When the change value of PID parameter output from the output layer 303 is out of the normal range, the weight parameters are automatically adjusted such that, when the data including at least one temperature behavior parameter that have been prepared for learning is input again to the input layer 301 of the neural network, the change value of PID parameter output from the output layer 303 is within the normal range. In this manner, the learned model is constructed by repeatedly inputting at least one temperature behavior parameter to the input layer, comparing the output value from the output layer with the normal range, and adjusting the weight parameters.

Furthermore, it is preferable for the controller 40 to input data for checking into the neural network, and check whether or not data output from the neural network corresponds to data to be included in the normal range. The data for checking may be produced by extracting in advance a part of the training data set produced in step 3. Alternatively, all training data set produced in Step 3 may be used as the data for checking. In this case, all training dataset produced in Step 3 is input to the learned model again, and the adjustment of the weight parameters is repeated using the same training dataset.

In one embodiment, the neural network may include an input layer 301' different from the input layer 301. In the input layer 301', for example, data different from the temperature behavior parameter may be input, or the temperature behavior parameter different from the temperature behavior parameter that is input to the input layer 301 may be input. Examples of data input to the input layer 301' include the plurality of temperature behavior curves stored in the memory 110, and/or the combinations of the measured values of the pad-temperature measuring device 39 and the measurement time points thereof, which have been used in creating each temperature behavior curve. Another example of data input to the input layer 301' is a usage time of consumable used in the polishing unit. Examples of consumable include the polishing pad 3, a retaining ring (not shown) which prevents the wafer W from coming off from the polishing head 1 during polishing of the wafer W, and a membrane (not shown) which is disposed at a lower part of the polishing head 1 to press the wafer W against the polishing pad 3 with a predetermined pressing force.

Still other examples of data input to the input layer 301' are temperature behavior parameters representing a temporal change in state quantities that affect temperature behavior (e.g., the temperature of the heating liquid, the rotation speed of the polishing head 1, the rotation speed of the polishing table 2, the dressing conditions, the polishing load of the polishing head 1, and the flow rate of the polishing liquid). Still another examples of data input to the input layer 301' are temperature behavior parameters representing a temporal change in environment that affect the temperature behavior (e.g., the pressing load of the pad contact member 11, the temperature of the polishing liquid, the temperature of atmosphere in the polishing unit, the supply pressure of the heating liquid, and the supply pressure of the cooling liquid).

The data different from the temperature behavior parameter, the temperature behavior parameter representing the temporal change in the state quantity that affects the temperature behavior, and/or the temperature behavior parameter representing the temporal change in the environment that affects the temperature behavior are input to the neural network, so that the output layer 303 of the neural network can output a more accurate prediction (i.e., the temperature behavior parameter to be changed and the change value thereof). For example, the neural network can output the more accurate change value of the temperature behavior parameter to be changed, which takes into account the temporal change in the state quantities that affect the temperature behavior and/or the temporal change in the environment that affect the temperature behavior, from the output layer 303.

Furthermore, the neural network may include an output layer 303' different from the output layer 303. The output layer 303' outputs, for example, data that is different from the temperature behavior parameter to be changed, and the change value thereof. Examples of data output from the output layer 303' are an optimal temperature behavior curve representing a time course of the optimal pad surface temperature to be regulated when polishing the wafer W, and/or a combination of the pad surface temperatures and measurement time points thereof which constructs the optimal temperature behavior curve. Another examples of data output from the output layer 303' are other temperature behavior parameters different from the PID parameters. For example, the output layer 303' may output other temperature behavior parameters to be changed, which are different from the PID parameters, and the change values thereof in order to maintain the temperature behavior curve within the predetermined allowable range. Alternatively, the output layer 303' may output a predicted value of the change in the other temperature behavior parameter different from the PID parameter when the PID parameter output from the output layer 303 is changed.

The learned model constructed in this manner is stored in the memory 110 (see FIG. 5). The controller 40 operates in accordance with a program electrically stored in the memory 110. More specifically, the processing unit 120 of the controller 40 performs operations: to input data including at least one temperature behavior parameter to the input layer 301 of the learned model; and to output the at least one temperature behavior parameter to be changed, and the change value thereof to maintain the temperature behavior curve R in the predetermined allowable range, from the output layer 303.

As described above, Changing the PID parameters causes the manipulated variables for the first flow control valve 42 and the second flow control valve 56 to be changed, resulting in the change in the flow rate of the heating liquid and the flow rate of the cooling liquid. The change in the PID parameters (in particular, the proportional gain P) has the direct and significant effect on the change in the temperature behavior (i.e., the temperature behavior curve). Hereinafter, an embodiment, in which, as the temperature behavior parameter to be changed, the PID parameters and the change values thereof are output from the output layer 303, will be described.

In a first example, the controller 40 inputs the PID parameters, the flow rate of the heating liquid, and the flow rate of the cooling liquid to the input layer 301. The learned model is constructed such that, when the PID parameters, the flow rate of the heating liquid, and the flow rate of the cooling liquid are input to the input layer 301, the PID parameters to be changed and the change values thereof in order to maintain the temperature behavior curve R within the predetermined allowable range are output from the output layer 303. The learned model may be constructed so as to output at least one of the PID parameters (e.g., proportional gain P) and the change value thereof from the output layer 303.

In one embodiment, the controller 40 may input the times (see the item 21 described above) above) at which each data of the PID parameters, the flow rate of the heating liquid, and the flow rate of the cooling liquid have been acquired, to the input layer 301'. Alternatively, the controller 40 may input the PID parameters, the flow rate of the heating liquid, and the flow rate of the cooling liquid as well as the time at which each data of the PID parameters, the flow rate of the heating liquid, and the flow rate of the cooling fluid have been acquired, to the input layer 301.

The temperature behavior parameters described in the items 1) through 20) are acquired by various sensors arranged in the polishing unit. Times when the various sensors acquire the measured values of the temperature behavior parameters are different from each other. For example, time when a sensor for measuring the flow rate of the heating liquid acquires a value of flow rate of the heating liquid is different from time when a sensor for measuring the flow rate of the cooling liquid acquires a value of flow rate of the cooling liquid. Furthermore, time between a transmission of the temperature behavior parameter acquired by each sensor to the controller 40 and a receipt of the temperature behavior parameter by the controller 40 is also different from each other. For example, a time when the controller 40 receives a value of flow rate of the heating liquid transmitted from a sensor for measuring the flow rate of the heating liquid is different from a time when the controller 40 receives a value of flow rate value of the cooling liquid transmitted from the sensor for measuring the flow rate of the cooling liquid. This is because cable lengths extending from each sensor to the controller 40 are different from each other due to the different distances between each sensor and the controller 40, and because devices, such as amplifiers, installed in each sensor are different from each other.

In order for the output layer 303 of the neural network to more accurately output at least one temperature behavior parameter to be changed and the change value thereof to maintain the temperature behavior curve R in the predetermined allowable range, it is desirable to match the times of each temperature behavior parameter acquired by the controller 40. However, as described above, it is difficult to match the times when the controller 40 acquires each temperature behavior parameter. Accordingly, the times are additionally input to the input layer 301 (or the input layer 301') of the neural network. The neural network with the times input calculates each prediction value that matches the measurement times of the plurality of temperature behavior parameters based on the changes in a time course of the plurality of temperature behavior parameters input other than the times, and outputs the PID parameter to be changed and the change value thereof from the output layer 303 based on this prediction value. This operation allows a more accurate output value that takes into account the time difference of each temperature behavior parameter acquired by the controller 40 to be obtained.

In one embodiment, the controller 40 may further input to the input layer 301' of the learned model the combination of the measured values of the pad-temperature measuring device 39 and the measurement time points, and/or the temperature behavior curve created based on the measured values of the pad-temperature measuring device 39 and the measurement time points. In this case also, the learned model outputs at least one of the PID parameters (e.g., proportional gain P) and the change value thereof in order to maintain the temperature behavior curve within the predetermined allowable range, from the output layer 303.

The controller 40 changes the PID parameters according to the output from the learned model, and polishes next wafer W while regulating the surface temperature of the polishing pad 3 according to the changed PID parameters. The data set in which the PID parameters, the flow rate of the heating liquid, and the flow rate of the cooling liquid is combined is the combination of parameters that has the most influence on the change in the temperature behavior (i.e., the temperature behavior curve). Therefore, by inputting the data set of the first example to the input layer 301, it can be expected that the learned model outputs the most appropriate PID parameters and the change values thereof. As described above, the learned model may further output from the output layer 303' the optimal temperature behavior curve and/or the combination of the pad surface temperatures and the measurement time points thereof which constructs the optimal temperature behavior curve.

In one embodiment, the learned model may output from the output layer 303' other temperature behavior parameters to be changed, which are different from the PID parameters, and the change values thereof in order to maintain the temperature behavior curve within the predetermined allowable range. In this case, the controller 40 updates the PID parameters to the change values output from the output layer 303, and at the same time updates the other temperature behavior parameters to the change values output from the output layer 303'. In this case, the temperature behavior curve can be more effectively prevented from being out of the allowable range.

In a second example, the controller 40 inputs the temperature of the heating liquid, the rotation speed of the polishing head 1, the rotation speed of the polishing table 2, the dressing conditions, the polishing load of the polishing head 1, and the flow rate of the polishing liquid to the input layer 301. The learned model is constructed such that, when the temperature of the heating liquid, the rotation speed of the polishing head 1, the rotation speed of the polishing table 2, the dressing conditions, the polishing load of the polishing head 1, and the flow rate of the polishing liquid are input to the input layer 301, the PID parameters (or at least one of the PID parameters) to be changed and the change values thereof in order to maintain the temperature behavior curve R within the predetermined allowable range are output from the output layer 303.

The data set of the second example is a representative combination of the temperature behavior parameters representing the temporal change in the state quantities that affect temperature behavior. For example, the temperature of the heating liquid is a state quantity that changes from time to time while the pad-temperature regulating apparatus 5 regulates the surface temperature of the polishing pad 3, and the temporal change in the temperature of the heating liquid affects the change in the temperature behavior. Therefore, by inputting the data set of the second example to the input layer 301, the output layer 303 can output the PID parameters to be changed and the change values thereof based on the temporal change in the state quantities affecting the temperature behavior.

Similar to the first example, the controller 40 may input the time to the input layer 301' (or input layer 301) of the learned model. Further, the controller 40 may input to the input layer 301' of the learned model the combination of the measured values of the pad-temperature measuring device 39 and the measurement time points, and/or the temperature behavior curve created based on the measured values of the pad-temperature measuring device 39 and the measurement time points. Further, the learned model may output from the output layer 303' other temperature behavior parameters to be changed, which are different from the PID parameters, and output the change values thereof in order to maintain the temperature behavior curve within the predetermined allowable range. Further, the learned model may output from the output layer 303' the optimal temperature behavior curve and/or the combination of the pad surface temperatures and the measurement time points thereof which constructs the optimal temperature behavior curve.

The controller 40 changes the PID parameters according to the output from the learned model, and polishes next wafer W while regulating the surface temperature of the polishing pad 3 according to the changed PID parameters. In the case where the learned model in which the data set of the second example is input is constructed to regulate the pad surface temperature, it is unnecessary to modify each component of the polishing apparatus. In other words, the data set of the second example comprises only of parameters that are constantly monitored in already-existing polishing apparatus. Therefore, by simply installing this learned model in the controller 40, the temperature behavior curve R can be maintained within the predetermined allowable range without modifying the already-existing polishing apparatus. As a result, it is possible to provide a polishing apparatus with decreased variation in polishing performance at a low cost.

In one embodiment, in addition to the data set of the second example, the data set of the first example may be input to the input layer 301 (or the input layer 301'). As described above, the data set of the second example is the representative combination of the temperature behavior parameters representing the temporal change in the state quantities that affect temperature behavior. Therefore, by inputting the combination of the data set of the first example and the data set of the second example to the input layer 301, the output layer 303 outputs the PID parameters to be changed and the change values thereof, taking into account the temporal change in the state quantities affecting the temperature behavior. As a result, the neural network is able to output the PID parameters to be changed and the change values thereof with enhanced accuracy.

In a third example, the controller 40 inputs the pressing load of the pad contact member 11, the temperature of the polishing liquid, the temperature of atmosphere in the polishing unit, the supply pressure of the heating liquid, and the supply pressure of the cooling liquid to the input layer 301. The learned model is constructed such that, when the pressing load of the pad contact member 11, the temperature of the polishing liquid, the temperature of atmosphere in the polishing unit, the supply pressure of the heating liquid, and the supply pressure of the cooling liquid are input to the input layer 301, the PID parameters (or at least one of the PID parameters) to be changed and the change values thereof in order to maintain the temperature behavior curve R within the predetermined allowable range are output from the output layer 303.

The data set of the third example is a representative combination of the temperature behavior parameters representing the temporal change in the environment that affect temperature behavior. Therefore, by inputting the data set of the third example to the input layer 301, the output layer 303 can output the PID parameters to be changed and the change values thereof based on the temporal change in the environment affecting the temperature behavior.

Similar to the first example, the controller 40 may input the time to the input layer 301' (or input layer 301) of the learned model. Further, the controller 40 may input to the input layer 301' of the learned model the combination of the measured values of the pad-temperature measuring device 39 and the measurement time points thereof, and/or the temperature behavior curve created based on the measured values of the pad-temperature measuring device 39 and the measurement time points thereof. Further, the learned model may output from the output layer 303' other temperature behavior parameters to be changed, which are different from the PID parameters, and the change values thereof in order to maintain the temperature behavior curve within the predetermined allowable range. Further, the learned model may output from the output layer 303' the optimal temperature behavior curve and/or the combination of the pad surface temperatures and the measurement time points thereof which constructs the optimal temperature behavior curve.

The controller 40 changes the PID parameters according to the output from the learned model, and polishes next wafer W while regulating the surface temperature of the polishing pad 3 according to the changed PID parameters. In the case where the learned model in which the data set of the third example is input is constructed to regulate the pad surface temperature, it is necessary to modify the polishing apparatus. However, by installing this learned model in the controller 40, the temperature behavior curve R can be maintained within the predetermined allowable range.

In one embodiment, in addition to the data set of the third example, the data set of the first example may be input to the input layer 301 (or the input layer 301'). As described above, the data set of the third example is the representative combination of the temperature behavior parameters representing the temporal change in the environment that affects temperature behavior. Therefore, by inputting the combination of the data set of the first example and the data set of the third example to the input layer 301, the output layer 303 outputs the PID parameters to be changed and the change values thereof, taking into account the temporal change in the environment affecting the temperature behavior. As a result, the neural network is able to output the PID parameters to be changed and the change values thereof with enhanced accuracy.

Further, in addition to the data set of the third example, the data set of the first example and the data set of the second example may be input to the input layer 301 (or the input layer 301'). By inputting the combination of the data set of the first example, the data set of the second example, and the data set of the third example to the input layer 301, the output layer 303 outputs the PID parameters to be changed and the change values thereof, taking into account the temporal changes in the state quantities and the environment affecting the temperature behavior. As a result, the neural network is able to output the PID parameters to be changed and the change values thereof with enhanced accuracy.

In a fourth example, the controller 40 inputs the combination of the measured values of the pad-temperature measuring device 39 and the measurement time points thereof to the input layer 301' only. The learned model is constructed such that, when the combination of the measured values of the pad-temperature measuring device 39 and the measurement time points thereof are input to the input layer 301', the PID parameters to be changed and the change values thereof in order to maintain the temperature behavior curve R within the predetermined allowable range are output from the output layer 303. Similar to the first example, the learned model may output from the output layer 303' the optimal temperature behavior curve and/or the combination of the pad surface temperatures and the measurement time points thereof which constructs the optimal temperature behavior curve.

The controller 40 changes the PID parameters according to the output from the learned model, and polishes next wafer W while regulating the surface temperature of the polishing pad 3 according to the changed PID parameters. In the case where the learned model in which the data set of the fourth example is input is constructed to regulate the pad surface temperature, it is modify each component of the polishing apparatus as in the second example. Therefore, by simply installing this learned model in the controller 40, the temperature behavior curve R can be maintained within the predetermined allowable range.

In the embodiments described above, at least one film thickness parameter associated with a thickness of film of the wafer W to be polished by the polishing unit may be further input to the input layer 301 (or the input layer 301'). In other words, the controller 40 may input the at least one temperature behavior parameter and the at least one film thickness parameter to the input layer 301. In this case, the controller 40 may further input at least one of the data sets shown in the first to fourth examples to the input layer 301 (or the input layer 301'). In this specification, the film thickness parameter is a generic term for an index value associated with the thickness of film formed on the surface of the wafer (substrate) W. As will be described below, the film thickness parameter includes, for example, a film thickness signal acquired by a film thickness sensor, and a film thickness value obtained by calculating (or converting) the film thickness signal.

Conventionally, a film thickness sensor is used to detect a thickness of a film formed on the surface of the wafer W in order to detect the polishing endpoint, which is a time point at which the desired target film thickness is reached in the polishing process of polishing the wafer W. For example, when the film on the wafer W to be polished by the polishing unit is a conductive film, an eddy current film thickness sensor is used to detect the thickness of the conductive film. The eddy current film thickness sensor is configured to induce eddy current in the conductive film of the wafer W by passing a high-frequency alternating current through a coil, and detects the thickness of the conductive film from a change in impedance due to a magnetic field of the induced eddy current. Any film thickness sensor can be used as long as it is capable of detecting the thickness of the film formed on the surface of the wafer W. Hereinafter, an example of detecting the thickness of the conductive film of the wafer W using the eddy current film thickness sensor, which is an example of the film thickness sensor, will be described.

Figure 13A:
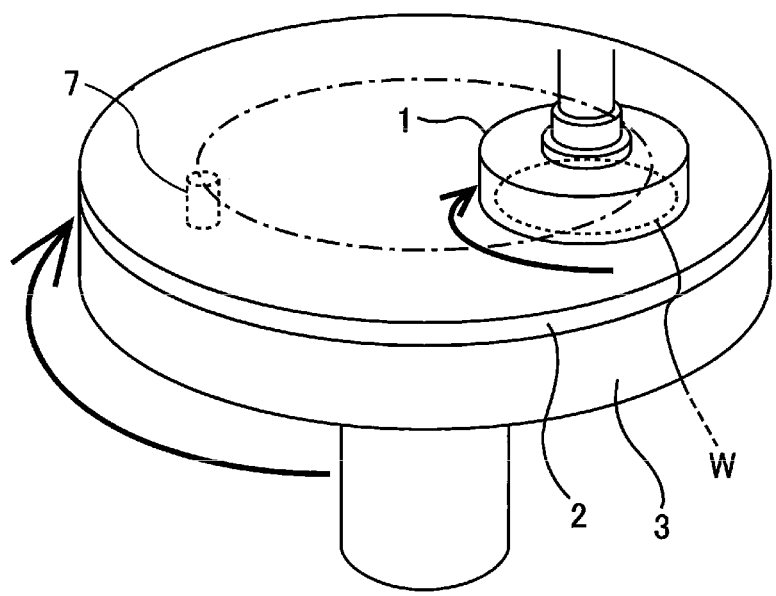
FIG. 13A is a schematic view showing an example of a polishing unit equipped with an eddy current film thickness sensor.
Figure 13B:
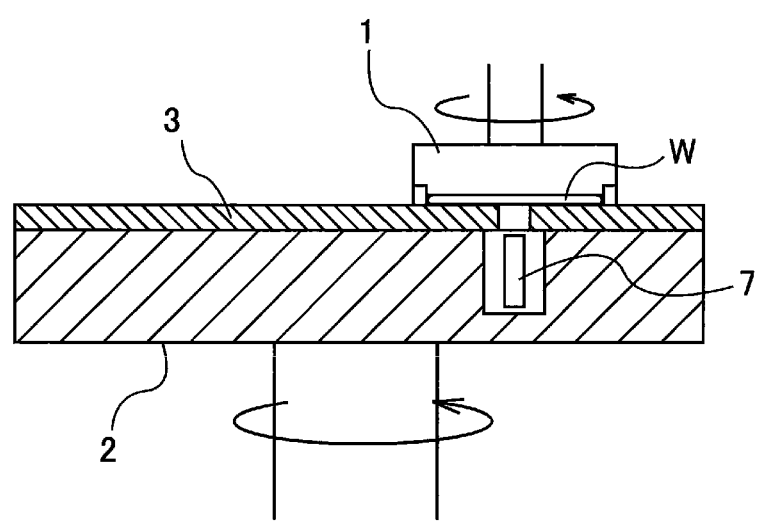
FIG. 13B is a schematic cross-sectional view of the polishing unit shown in FIG. 13A.

FIG. 13A is a schematic view showing an example of a polishing unit equipped with an eddy current film thickness sensor, and FIG. 13B is a schematic cross-sectional view of the polishing unit shown in FIG. 13A. In FIGS. 13A and 13B, the components of the polishing unit other than the polishing head 1, polishing table 2, polishing pad 3, and eddy current film thickness sensor 7 are omitted. FIG. 13B illustrates the eddy current film thickness sensor passing below the wafer. Configuration of the polishing unit of this embodiment, which is not specifically described, is the same as the configuration of the polishing unit of the above-described embodiments, and thus duplicate descriptions thereof are omitted.

As shown in FIGS. 13A and 13B, the eddy current film thickness sensor 7 is embedded in the polishing table 2, and orbits around a central axis of the polishing table 2 as the polishing table 2 rotates. The central axis of the polishing table 2 extends vertically through a center CL of the polishing pad 3 shown in FIGS. 2 and 3. The eddy current film thickness sensor 7 acquires the film thickness signal in at least one measurement point on the wafer W while scanning the surface of the wafer W every time the polishing table 2 rotates. The eddy current film thickness sensor 7 is connected to the controller 40, and the at least one film thickness signal acquired by the eddy current film thickness sensor 7 is sent to the controller 40. The film thickness signal changes according to a change in the thickness of conductive film of the wafer W. The film thickness signal is one of the film thickness parameters associated with the thickness of film of the wafer W to be polished. The controller 40 can monitor a polishing progress of the wafer W based on the film thickness signals. For example, the controller 40 can determine the polishing endpoint, which is a time point when the film thickness signal reaches a predetermined threshold value.

In one embodiment, the controller 40 may be configured to be able to obtain a film thickness value of conductive film by calculating the received film thickness signal. An actual film thickness value of conductive film, which changes according to the polishing progress of the wafer W, is one of the film thickness parameters. The controller 40 can monitor the polishing progress of the wafer W based on the film thickness values. For example, the controller 40 can determine a time point when the film thickness value of conductive film obtained by the calculation reaches the desired target film thickness as the polishing endpoint.

In this embodiment, every time the eddy current film thickness sensor 7 acquires a film thickness signal of the wafer W, the controller 40 inputs at least one temperature behavior parameter and at least one film thickness parameter to the input layer 301. When the eddy current film thickness sensor 7 acquires a plurality of film thickness signals in a plurality of measurement points, the controller 40 may input all of the film thickness signals to the input layer 301, or may input a representative value of the plurality of film thickness signals to the input layer 301. The representative value of the film thickness signal is, for example, any of the average, maximum value, and minimum value of all the film thickness signals. Alternatively, the controller 40 may input some of the film thickness signals, selected from all the film thickness signals, to the input layer 301. For example, the control unit 40 inputs the average, maximum value, and minimum value of all the film thickness signals to the input layer 301.

When the film thickness value of conductive film is acquired, the controller 40 may input the film thickness value obtained by calculation to the input layer 301 (or input layer 301') in addition to or instead of the thickness signal. The film thickness value is input to the input layer 301 (or input layer 301') every time the eddy current film thickness sensor 7 acquires the film thickness signal of the wafer W. When the eddy current film thickness sensor 7 acquires a plurality of film thickness signals in a plurality of measurement points, the controller 40 may input all the film thickness values obtained from all the film thickness signals to the input layer 301, or may input a representative film thickness value obtained from a representative value of the plurality of film thickness signals to the input layer 301. The representative film thickness value is, for example, a film thickness value obtained from any of the average, maximum value, and minimum value of all the film thickness signals. Alternatively, the controller 40 may input selected thickness values obtained from some of the film thickness signals, selected from all the film thickness signals, to the input layer 301. For example, the controller 40 inputs three selected film thickness values obtained from the average, maximum value, and minimum value of all the film thickness signals to the input layer 301.

As described above, the learned model outputs from the output layer 303 the PID parameters to be changed and the change values thereof. In this embodiment, the learned model is constructed to further predict the polishing endpoint of the wafer W every time the eddy current film thickness sensor 7 acquires the film thickness signal of the wafer W, and output the predicted polishing endpoint from the output layer 303 (or output layer 303'). In one embodiment, the learned model may be constructed to predict, instead of or in addition to the predicted polishing endpoint, a polishing completion time, representing a time from the present time to the polishing endpoint, every time the eddy current film thickness sensor 7 acquires the film thickness signal of the wafer W, and output the predicted polishing completion time from the output layer 303 (or output layer 303'). This predicted polishing endpoint and/or the polishing completion time is a polishing endpoint and/or a polishing completion time of the wafer W that is polished with the pad surface temperature regulated according to the optimum PID parameters, while taking into account the thickness of film polished (i.e., changing) from time to time. Therefore, the film thickness of the wafer W to be polished can be more accurately matched to the target film thickness.

In the embodiments described above, the amount of change in the thickness of the polishing pad 3 may be further input to the input layer 301 (or the input layer 301'). In other words, the controller 40 may input the at least one temperature behavior parameter and the amount of change in the thickness of the polishing pad 3 to the input layer 301. In this case, the controller 40 may further input at least one of the data sets shown in the first to fourth examples to the input layer 301 (or the input layer 301').

The amount of change in the thickness of the polishing pad 3 is a parameter that affects the polishing rate of the wafer W. In other words, when the thickness of the polishing pad 3 changes, the polishing rate of the wafer W also changes. Therefore, the amount of change in the thickness of the polishing pad 3 is one of parameters representing a temporal change in the polishing environment. Accordingly, in this embodiment, the pad surface temperature is regulated in order to maintain the polishing rate at an optimal level. Specifically, the learned model is constructed such that, when the amount of change in the thickness of the polishing pad 3 as well as the at least one temperature behavior parameter are input to the input layer 301 (or input layer 301'), the temperature behavior curve in order to maintain the optimal polishing rate is predicted, and the PID parameters to be changed and the change values thereof in order to achieve this predicted temperature behavior curve are output from the output layer 303. Hereinafter, an example of a polishing unit capable of measuring the change in thickness of the polishing pad 3 will be described.

Figure 14:
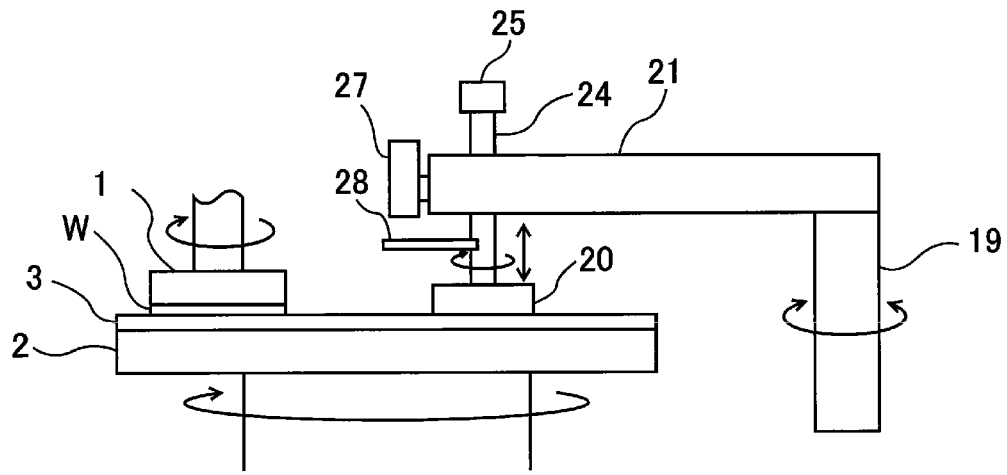
FIG. 14 is a schematic view showing an example of a polishing unit equipped with a pad height sensor for measuring an amount of change in a thickness of the polishing pad.

FIG. 14 is a schematic view showing an example of a polishing unit equipped with a pad height sensor for measuring an amount of change in the thickness of the polishing pad. In FIG. 14, the pad-temperature regulating apparatus 5 is omitted. Configuration of the polishing unit in this embodiment, which is not specifically described, is the same as that of the polishing unit for the above described embodiments, and thus duplicate descriptions thereof are omitted.

In the polishing unit shown in FIG. 14, the dresser 20 is coupled to a dresser shaft 24, and an air cylinder 25 is provided at an upper end of the dresser shaft 24. The dresser shaft 24 is rotatably supported by a dresser arm 21. Furthermore, the dresser shaft 24 and the dresser 20 can move vertically with respect to the dresser arm 21. The air cylinder 25 serves as a device for applying a dressing load (i.e., a pressing load of the dresser 20 to the polishing pad 3) to the dresser 20. The dressing load can be regulated by an air pressure supplied to the air cylinder 25. The air cylinder 25 presses the dresser 20 to the surface of the polishing pad 3 (i.e., the polishing surface) with a predetermined load through the dresser shaft 24.

The dresser arm 21 is configured to oscillate on a support shaft 19 by actuation of a motor (not shown). The dresser arm 21 causes the dresser 20 to oscillate in the radial direction of the polishing pad 3 while contacting the polishing pad 3. The dresser shaft 24 is rotated by a motor (not shown) arranged in the dresser arm 21, and the rotation of the dresser shaft 24 causes the dresser 20 to be rotated around its axial center.

A pad height sensor (surface height measuring device) 27 for measuring a height of the surface of the polishing pad 3 is secured to the dresser arm 21. Furthermore, a sensor target 28, located opposite to the pad height sensor 27, is secured to the dresser shaft 24.

When the air cylinder 25 is set in motion, the dresser 20, dresser shaft 24, and sensor target 28 move vertically in unison. On the other hand, the dresser arm 21 and the pad height sensor 27 are fixed in their positions with respect to a vertical direction. The pad height sensor 27 measures a vertical position of the dresser 20 with respect to the dresser arm 21 when the dresser 20 is in contact with the surface of the polishing pad 3 (i.e., the polishing surface) to indirectly measure the height of the surface of the polishing pad 3. The sensor target 28 is coupled to the dresser 20, so that the pad height sensor 27 can measure the height of the surface of the polishing pad 3 during conditioning of the polishing pad 3. The pad height sensor 27 may comprise any type of sensors, such as a linear scale sensor, a laser sensor, an ultrasonic sensor, and an eddy current sensor. The pad height sensor 27 is connected to the controller 40, and the measured value of the thickness of the polishing pad 3 acquired by the pad height sensor 27 is sent to the controller 40.

The amount of change in the thickness of the polishing pad 3 can be determined as follows. First, the air cylinder 25 is set in motion to place the dresser 20 into contact with the surface of the polishing pad 3 that has not been worn. In this state, the pad height sensor 27 measures an initial position of the dresser 20 (an initial surface height of the polishing pad 3), and thus the controller 40 obtains the measured value of the initial position of the dresser 20. After the polishing process of one or a plurality of wafers W is completed, the dresser 20 is placed into contact with the surface of the polishing pad 3 again, and in this state, the pad height sensor 27 measures the position of the dresser 20 again. The controller 40 obtains the measured value of that position of the dresser 20 (i.e., the surface height of the worn polishing pad 3). Since the dresser 20 displaces downward as the polishing pad 3 wears, the controller 40 can determine the amount of change in the thickness of the polishing pad 3 from a difference between the measured value of the initial surface height of the polishing pad 3 and the measured value of the surface height of the worn polishing pad 3.

Typically, dressing of the polishing pad 3 is performed every time one wafer W is polished. Dressing is performed before or after polishing the wafer W, or during polishing of a wafer W. For calculating the amount of change in the thickness of the polishing pad 3, the measured values of the pad height sensor 27 acquired during any dressing are used.

The oscillation of the dresser arm 21 causes the dresser 20 to oscillate on the polishing pad 3 in the radial direction. The measured values of the surface height of the polishing pad 3 are sent from the pad height sensor 27 to the controller 40, where an average of the measured values of the surface height of the polishing pad 3 during dressing is calculated. For each dressing operation, the dresser 20 moves back and forth over the polishing pad 3 one or a plurality of times.

In this embodiment, every time the amount of change in thickness of the polishing pad 3 is acquired, the controller 40 inputs at least one temperature behavior parameter as well as the amount of change in thickness of the polishing pad 3 to the input layer 301 (or the input layer 301'). The learned model predicts the temperature behavior curve required to maintain the optimal polishing rate, and outputs from the output layer 303 the PID parameters to be changed and the change values thereof in order to achieve this predicted temperature behavior curve. In this manner, the output layer 303 outputs the PID parameters to be changed and the change values thereof in order to maintain the optimal polishing rate, taking into account the amount of change in the thickness of the polishing pad 3 that affects the polishing rate. The controller 40 changes the PID parameters according to the output from the learned model, and polishes next wafer W while regulating the surface temperature of the polishing pad 3 according to the changed PIP parameters.

In one embodiment, the polishing rate may be further input to the input layer 301 (or the input layer 301'). The controller 40 can obtain an actual polishing rate by dividing the thickness of the polished film by the polishing time (i.e., a time from the start of polishing to the end of polishing). By further inputting the actual polishing rate to the input layer 301 (or the input layer 301'), the neural network can output the PID parameters to be changed and the change values thereof with enhanced accuracy.

In one embodiment, the learned model may be constructed such that, when at least one temperature behavior parameter and the amount of change in thickness of the polishing pad 3 (and polishing rate) are input to the input layer 301, the output layer 303 (or output layer 303') further outputs dressing conditions. The dressing conditions include, for example, the rotation speed of the dresser 20, the pressing load of the dresser 20 against the polishing pad 3, and the oscillation speed of the dresser 20. By dressing the polishing pad 3 with the dressing conditions output from the output layer 303, a surface condition of the polishing pad 3 can be maintained at or near the surface condition for maintaining the optimal polishing rate.

The controller 40 operates according to the program electrically stored in the memory 110. Specifically, the controller 40 performs the steps of: controlling at least the flow rates of the heating liquid and the cooling liquid such that the pad surface temperature reaches the predetermined target temperature based on the pad surface temperature measured by the pad-temperature measuring device 39, and then the pad surface temperature is maintained at the target temperature; creating the temperature behavior curve until the pad surface temperature reaches the target temperature; inputting at least one temperature behavior parameter to the learned model constructed by machine learning to perform the calculation for outputting the change value of the PID parameter in the PID control, and controlling the flow rates of the heating liquid and the cooling liquid with the changed PID parameter when polishing the next wafer W.

The program for causing the controller 40 to perform the above steps is stored in a non-transitory tangible computer-readable storage medium. The controller 40 is provided with the program via the storage medium. The controller 40 may be provided with the program by use of the communication device 150 via a communication network, such as the Internet. The program provided to the controller 40 is installed in the memory 110 by the processing unit 120. Further, when updating the old program to the new program (e.g., upgrading the program), the new program is provided to the controller 40 through the communication device 150 or through the input device 130. The processing unit 120 installs the provided new program in the memory 110 to update the old program. The processing unit 120 may install the new program into the memory 110 after uninstalling the old program from the memory 110.

Thus, even if the pad surface temperature is regulated while changing the PID parameters using artificial intelligence, the temperature behavior range R may deviate from the predetermined allowable range as shown in FIG. 7. If the temperature behavior curve R deviates from the predetermined allowable range, the controller 40 preferably outputs an alarm. An operator of the polishing apparatus who receives the alarm can detect that an abnormality in the temperature behavior has occurred in the polishing unit in which the alarm is output. Further, the operator can check a state of the wafer W on which the abnormality in the temperature behavior has occurred.

The controller 40 may stop the operation of the polishing unit in which the alarm has been output after or at the same time as the alarm is output. This operation allows the operator of the polishing apparatus to collect the wafer W on which the abnormality in the temperature behavior has occurred and to check the status of the wafer W and the polishing unit. In one embodiment, the controller 40 may perform a step of placing the wafer W being polished in the polishing unit at which the alarm has been output, on a wafer waiting section (not shown) after the operation of the polishing unit is stopped. The wafer waiting section is preferably provided in the polishing unit. This operation allows the operator of the polishing apparatus to easily and reliably collect the wafer W on which the abnormality in the temperature behavior has occurred.

A wafer cassette that houses a predetermined number of wafers (e.g., 25 wafers) may be accidentally transferred to the polishing apparatus. In this embodiment, the controller 40 can determine an erroneous transfer of the wafer cassette. More specifically, when the wafer cassette is erroneously transferred to the polishing apparatus, the polishing recipe used to polish the wafers W housed in this wafer cassette is different from a proper polishing recipe to be used. If the wafer W is polished using a polishing recipe that is different from the proper polishing recipe to be used, it is assumed that the temperature behavior curve becomes significantly deviated from the allowable range. In this embodiment, the operator can easily check whether or not the wafer cassette has been erroneously transferred, because the operator can collect the wafer W on which the abnormality in the temperature behavior has been occurred. As a result, it is possible to prevent all of the wafers W housed in the wafer cassette from being disposed.

Figure 15:
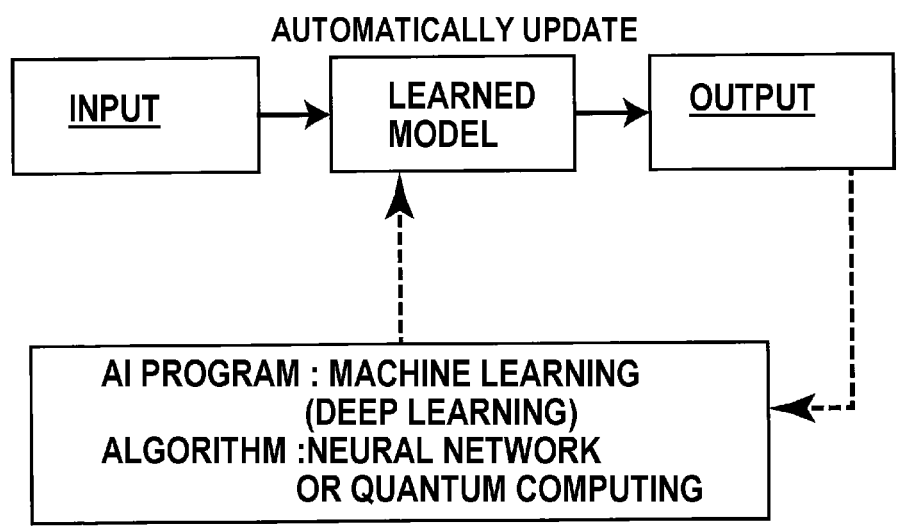
FIG. 15 is a schematic view showing another example of configuration of the artificial intelligence shown in FIG. 10.

FIG. 15 is a schematic view showing another example of the artificial intelligence shown in FIG. 10. The artificial intelligence shown in FIG. 15 has a feature of automatically updating the learned model. More specifically, when the change values of the PID parameters output from the output layer 303 of the learned model are determined to be included in the normal range, the controller 40 stores these PID parameters and the change values thereof in the memory 110 as an additional learning data set, and performs the machine learning (deep learning) based on the learning data set and the additional learning data set to automatically updates the learned model. This operation enables the accuracy of the PID parameters (at least one temperature behavior parameter) and the change values output from the learned model to be improved.

The machine learning (deep learning) can learn not only the combination of PID parameters (at least one temperature behavior parameter) to be changed and the change values thereof, but also various other factors. Therefore, the learned model constructed by the machine Learning can be used to diagnose or predict a state and/or an abnormality of the pad temperature regulating apparatus 5. Further, the learned model constructed by the machine learning can be used to diagnose or predict a state and/or an abnormality of the polishing unit. For convenience of explanation, the learned model according to the above-described embodiments may be referred to as "learned model 1" in the following. Further, the learned model described below may be referred to as "learned model 2.

The learned model 2 is constructed using the neural network described with reference to FIG. 12. This learned model 2 is constructed to predict an life of the polishing pad 3 and/or an life of the dresser 20 when the temperature behavior curve R created based on the measured values of pad-temperature measuring device 39 and the measurement time points, and the plurality of temperature behavior curves stored in the memory 110 are input to the input layer 301, and to output the predicted result from the output layer 303. Alternatively, the learned model 2 may be constructed to diagnose the abnormality of the polishing head 1, the abnormality of the polishing table 3, and the abnormality of the polishing liquid supply nozzle 4 when the temperature behavior curve R created based on the measured values of pad-temperature measuring device 39 and the measurement time points, and the plurality of temperature behavior curves stored in the memory 110 are input to the input layer 301, and to output the diagnosed results from the output layer 303.

Polishing the wafer W by pressing the wafer W against the polishing pad 3 causes the polishing pad 3 to be deteriorated, resulting in decreasing the amount of frictional heat generated between the polishing pad 3 and the wafer W. Therefore, as the polishing pad 3 deteriorates, a slope of the temperature behavior curve is gradually decreased. Alternatively, as the polishing pad 3 is scraped by the dresser 20, a depth of the grooves (not shown) formed on the surface of the polishing pad 3 is decreased, and eventually the grooves are disappeared. Due to such phenomenon, the amount of frictional heat generated between the polishing pad 3 and the wafer W may be decreased or increased, causing the slope of the temperature behavior curve to be changed. Accordingly, the learned model 2 compares the temperature behavior curve R created based on the measured values of the pad-temperature measuring device 39 and the measurement time points thereof, which are input to the input layer 301, with the plurality of temperature behavior curves stored in the memory 110, predicts the life of the polishing pad 3 based on the amount of decrease in the slope of the temperature behavior curve, and outputs the predicted result from the output layer 303.

Further, dressing the surface of the polishing pad 3 by use of the dresser 20 causes the dressing surface of the dresser 20 to be deteriorated, and thus the roughness of the surface of the polishing pad 3 after dressing becomes smaller. When the dressing surface is deteriorated, it may not be possible to dress the surface of the polishing pad 3 properly. Therefore, as the dresser 20 deteriorates, the amount of frictional heat generated between the polishing pad 3 and the wafer W is decreased or increased, so that the slope of the temperature behavior curve is gradually decreased or increased. Accordingly, the learned model 2 compares the temperature behavior curve R created based on the measured values of the pad-temperature measuring device 39 and the measurement time points thereof, which are input to the input layer 301, with the plurality of temperature behavior curves stored in the memory 110, predicts the life of the dresser 20 based on the amount of decrease or increase in the slope of the temperature behavior curve, and outputs the predicted result from the output layer 303.

In order to prevent the polishing liquid (slurry) from firmly adhering to a bottom surface of the pad contact member 11, a coating film may be attached to the bottom surface of the pad contact member 11. In this case, the learned model 2 may be constructed to diagnose a wear state of the coating film when the temperature behavior curve R created based on the measured values of pad-temperature measuring device 39 and the measurement time points, and the plurality of temperature behavior curves stored in the memory 110 are input to the input layer 301, and to output the diagnosed results from the output layer 303.

A material of the coating film is, for example, Teflon (registered trademark), which has a relatively high insulation effect. The pad contact member 11 is pressed against the surface of the polishing pad 3 with the predetermined pressing load, so that, every time the pad surface temperature is regulated, the coating film is worn. As the coating film wears, the slope of the temperature behavior curve is increased. Accordingly, the learned model 2 compares the temperature behavior curve R created based on the measured values of the pad-temperature measuring device 39 and the measurement time points thereof, which are input to the input layer 301, with the plurality of temperature behavior curves stored in the memory 110, predicts the life of the coating film based on the amount of increase in the slope of the temperature behavior curve, and outputs the predicted result from the output layer 303.

Changing the amount of frictional heat generated between the wafer held in the polishing head 1 and the surface of the polishing pad 3 also causes the temperature behavior curve to be changed. For example, if the polishing load of the wafer W against the polishing pad 3 deviates from the desired value, the temperature behavior curve is changed. The temperature behavior curve is also changed when the supply amount and/or the temperature of the polishing liquid deviates from the desired values, or when the dropping position of the polishing liquid deviates from the desired position. Furthermore, the temperature behavior curve is also changed when the rotation speed of the polishing head 1 and/or the rotation speed of the polishing table 3 deviates from the desired values. Therefore, the learned model 2 can compares the temperature behavior curve R created based on the measured values of the pad-temperature measuring device 39 and the measurement time points thereof, which are input to the input layer 301, with the plurality of temperature behavior curves stored in the memory 110 to thereby diagnose the abnormality of the polishing head 1, the abnormality of the polishing table 3, and the abnormality of the polishing liquid supply nozzle 4.

The controller 40 operates according to the program electrically stored in the memory 110. Specifically, the controller 40 performs the steps of: controlling at least the flow rates of the heating liquid and the cooling liquid such that the pad surface temperature reaches the predetermined target temperature based on the pad surface temperature measured by the pad-temperature measuring device 39, and then the pad surface temperature is maintained at the target temperature; creating the temperature behavior curve R until the pad surface temperature reaches the target temperature; and inputting the temperature behavior curve R and the plurality of temperature behavior curves stored in the memory 110 to the learned model constructed by machine learning to diagnose the life of the polishing pad 3 and/or the life of the dresser 20. Instead of the step of diagnosing the life of the polishing pad 3 and/or the life of the dresser 20, the controller 40 may perform the step of diagnosing the wear of the coating film, or may perform the step of diagnosing the abnormality of the polishing head 1, the abnormality of the polishing table 3, and the abnormality of the polishing liquid supply nozzle 4.

The program for causing the controller 40 to perform the above steps is stored in a non-transitory tangible computer-readable storage medium. The controller 40 is provided with the program via the storage medium. The controller 40 may be provided with the program by use of the communication device 150 via a communication network, such as the Internet. The program provided to the controller 40 is installed in the memory 110 by the processing unit 120. Further, when updating the old program to the new program (e.g., upgrading the program), the new program is provided to the controller 40 through the communication device 150 or through the input device 130. The processing unit 120 installs the provided new program in the memory 110 to update the old program. The processing unit 120 may install the new program into the memory 110 after uninstalling the old program from the memory 110.

Figure 16:
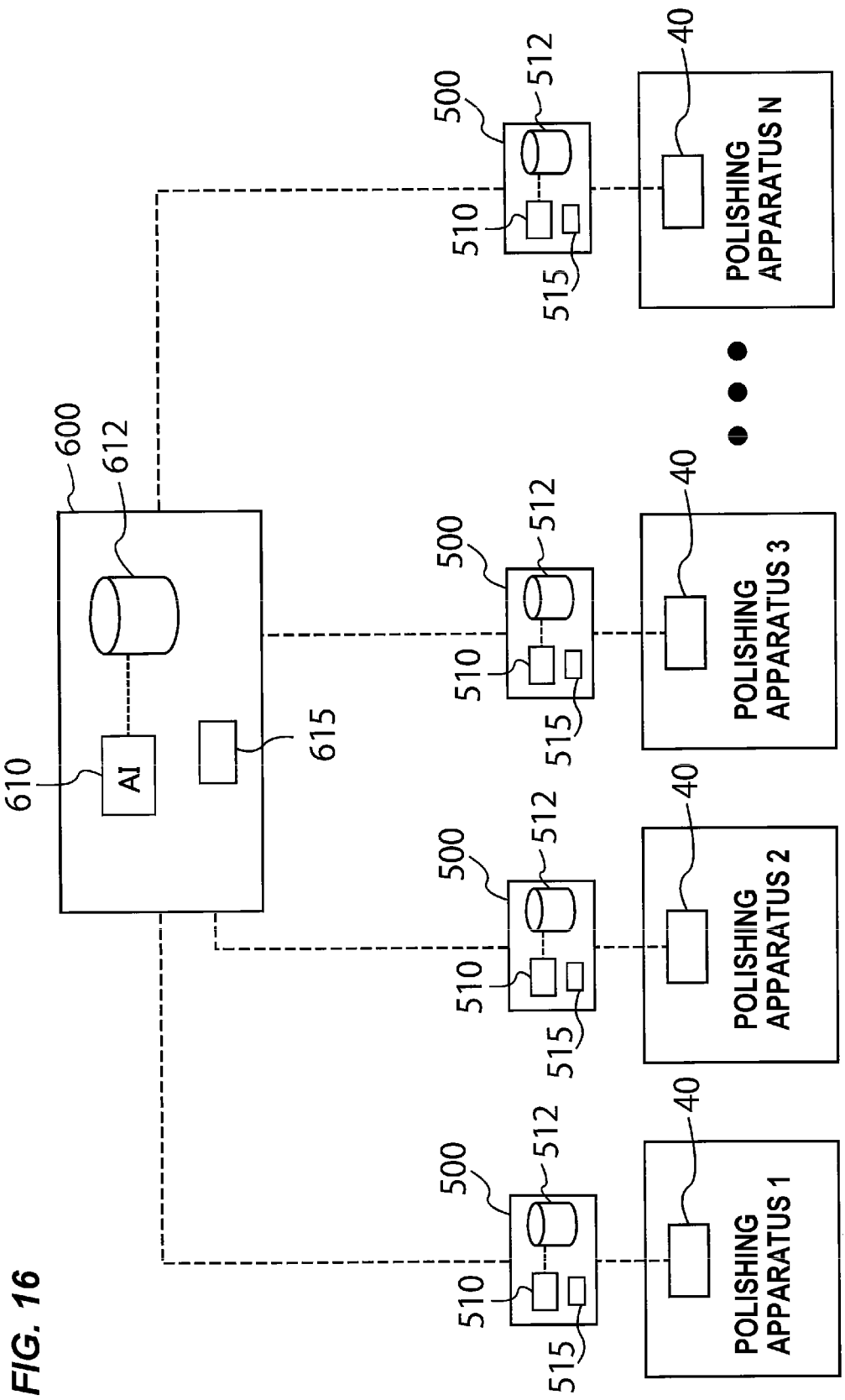
FIG. 16 is a schematic view showing an embodiment of a polishing system including at least one polishing apparatus.

FIG. 16 is a schematic view showing an embodiment of a polishing system including at least one polishing apparatus. The polishing system shown in FIG. 16 includes a plurality of substrate processing apparatuses according to the above-described embodiments, a plurality of relay devices 500 which are coupled to each substrate processing apparatus 1, and a host control system 600 which is coupled to the plurality of relay devices 500. The relay device 500 serves as a gateway, such as a router, and includes a relay controller 510, a relay communication device 515, and a relay memory 512. The host control system 600 includes a host controller 610, a host communication device 615, and a host memory 612.

The communication device 150 (see FIG. 5) of the controller 40 in the polishing apparatus is connected with the relay communication device 515 of the relay device 500 by wireless communication (for example, high speed WiFi (registered trademark)) or wire communication so as to be capable of transmitting and receiving information with each other. In this embodiment, each polishing apparatus is connected with the host control system 600 by a network (for example, Internet) through the relay device 500.

Further, the host control system 600 may be disposed inside a factory in which at least one polishing apparatus is installed, or may be disposed outside the factory in which at least one polishing apparatus is installed. If the host control system 600 is disposed inside the factory in which at least one polishing apparatus is installed, the host control system 600 may be a host computer disposed inside this factory, or may be a cloud computing system or a fog computing system constructed in this factory. If the host control system 600 is disposed outside the factory in which at least one polishing apparatus is installed, the host control system 600 is preferably a cloud computing system or a fog computing system. In this case, the host control system 600 is preferably connected with a plurality of factories in which at least one polishing apparatus is installed respectively.

In the example shown in FIG. 16, the relay device 500 is located outside the polishing apparatus. However, the present invention is not limited to this example. For example, the relay device 500 may be located inside the polishing apparatus.

In the embodiment shown in FIG. 16, the host controller 610 of the host control system 600 determines the PID parameters (at least one temperature behavior parameter) to be changed and the change values thereof in order to put the temperature behavior curve within the predetermined allowable range by use of artificial intelligence (AI). The host memory 612 of the host controller 610 stores in advance the learned model 1 described with reference to FIGS. 10 to 15. The host controller 610 has a processing device (not shown) which corresponds to the processing device 120 shown in FIG. 5. The processing device of the host controller 610 performs operations: to read the learned model stored in the host memory 612; to input at least one temperature behavior parameter to the learn model; and to output the PID parameters and the change values thereof.

In one embodiment, the processing device of the host controller 610 may input the time to the input layer 301' (or input layer 301) of the learned model 1. Further, the processing device of the host controller 610 may input to the input layer 301' of the learned model 1 the combination of the measured values of the pad-temperature measuring device 39 and the measurement time points thereof, and/or the temperature behavior curve created based on the measured values of the pad-temperature measuring device 39 and the measurement time points thereof. Further, the learned model 1 may output from the output layer 303' other temperature behavior parameters to be changed, which are different from the PID parameters, and the change values thereof in order to maintain the temperature behavior curve within the predetermined allowable range. Further, the learned model 1 may output from the output layer 303' the optimal temperature behavior curve and/or the combination of the pad surface temperatures and the measurement time points thereof which constructs the optimal temperature behavior curve.

In this embodiment, the controller 40 of each polishing apparatus transmits data including the combination of the measured values of the pad-temperature measuring device 39 and the measurement time points thereof, and at least one temperature behavior parameter to be input to the learned model 1, to the host control system 600 through the relay device 500. The host controller 610 of the host control system 600 that has received this data creates the temperature behavior curve R from the measured values of the pad-temperature measuring device 39 and the measurement time points thereof, and together inputs the at least one temperature behavior parameter to the input layer 301 of the learned model 1 stored in the host memory 612 to perform the calculation for outputting the PID parameters to be changed and the change values thereof in order to maintain the temperature behavior curve when polishing the next wafer W within the predetermined allowable range.

The PID parameters and the changed values thereof output from the output layer 303 of the learned model 1 are sent to the polishing apparatus through the relay device 500. The controller 40 of the polishing apparatus regulates the surface temperature of the polishing pad 3 in accordance with the PID parameters and the changed values thereof which has been received. In the case where other temperature behavior parameters to be changed, which are different from the PID parameters, and the change values thereof in order to maintain the temperature behavior curve within the predetermined allowable range, are output from the output layer 303', the controller 40 updates other temperature behavior parameters to the changed values.

A first example of data that the polishing apparatus sends to the host control system 600 for input to the learned model 1 is the PID parameters described above, the flow rate of the heating liquid, and the flow rate of the cooling liquid. A second example of data that the polishing apparatus sends to the host control system 600 is the temperature of the heating liquid, the rotation speed of the polishing head 1, the rotation speed of the polishing table 2, the dressing conditions, the polishing load of the polishing head 1, and the flow rate of the polishing liquid. A third example of data that the polishing apparatus sends to the host control system 600 is the temperature of the heating liquid the rotation speed of the polishing head 1, the rotation speed of the polishing table 2, the dressing conditions, the polishing load of the polishing head 1, and the flow rate of the polishing liquid. The data sent by the polishing apparatus to the host control system 600 for input to the learned model 1 may be a combination of the first to third examples. Further, the time described in the item 21) may be sent to the host control system 600 to be input to the learned model 1. In this case, the learned model 1 calculates each predicted value that matches the measurement time of the plurality of temperature behavior parameters based on the temporal changes of the plurality of temperature behavior parameters input other than the time, and outputs from the output layer 303 the PID parameters to be changed and the change values thereof based on this predicted value. This operation allows a more accurate output value that takes into account the time difference of each temperature behavior parameter acquired by the controller 40 to be obtained. Furthermore, in any of examples, for input to the learned model 1, the polishing apparatus may further transmit the combination of the measured values of the pad-temperature measuring device 39 and the measurement time points thereof, and/or the temperature behavior curve created based on the measured values of the pad-temperature measuring device 39 and the measurement time points thereof, to the host control system 60.

Another example of data that the polishing apparatus sends to the host control system 600 for input to the learned model 1 is at least one film thickness parameter associated with the thickness of film on the wafer W. As described above, the film thickness parameter includes the film thickness signal acquired by the film thickness sensor, and the actual film thickness value obtained by calculating (or converting) the film thickness signal. Further other examples of data that the polishing apparatus sends to the host control system 600 for input to the learned model 1 are the amount of change in the thickness of the polishing pad 3 and the polishing rate.

When the change values of the PID parameters output from the output layer 303 of the learned model 1 is determined to be included in the normal range, the host controller 612 of the host control system 600 stores these PID parameters and the change values thereof in the host memory 612 as an additional learning data set, and performs the machine learning (deep learning) based on the learning data set and the additional learning data set to automatically updates the learned model 1. Since a huge amount of data including the PID parameters to be changed and the change values thereof are sent to the host control system 600 from the plurality of polishing apparatus, the accuracy of the PID parameters and the change values thereof output from the output layer 303 of the learned model 1 can be improved in a short period of time.

The host memory 612 of the host control system 600 may store the learned model 2 described above in addition to the learned model 1. In this case, the host control system 600 may predict the life of the polishing pad 3 and/or the life of the dresser 20, and may diagnose the abnormality of the polishing head 1, the abnormality of the polishing table 3, and the abnormality of the polishing liquid supply nozzle 4. In the case where the coating film is provided on the bottom surface of the pad contact member 11, the learned model stored in the host memory 612 of the host control system 600 may diagnose the wear state of the coating film.

In one embodiment, the learned model 1 described above may be stored in the memory 110 of the control unit 40 of the polishing apparatus, and the learned model 2 described above may be stored in the host memory 612 of the host control system 600. In this case, the controller 40 of the polishing apparatus calculates the PID parameters to be changed and the change values in order to maintain the temperature behavior curve R in the predetermined allowable range, and the host controller 612 of the host control system 600 predicts the life of the polishing pad 3 and/or the life of the dresser 20, or diagnose the abnormality of the polishing head 1, the abnormality of the polishing table 3, and the abnormality of the polishing liquid supply nozzle 4.

Alternatively, the learned model 2 described above may be stored in the memory 110 of the controller 40 of the polishing apparatus, and the learned model 1 described above may be stored in the host memory 612 of the host control system 600. In this case, the controller 40 of the polishing apparatus may predict the life of the polishing pad 3 and/or the life of the dresser 20, or diagnose the abnormality of the polishing head 1, the abnormality of the polishing table 3, and the abnormality of the polishing liquid supply nozzle 4, and the host controller 612 of the host control system 600 calculates the PID parameters to be changed and the change values in order to maintain the temperature behavior curve R in the predetermined allowable range.

Figure 17:
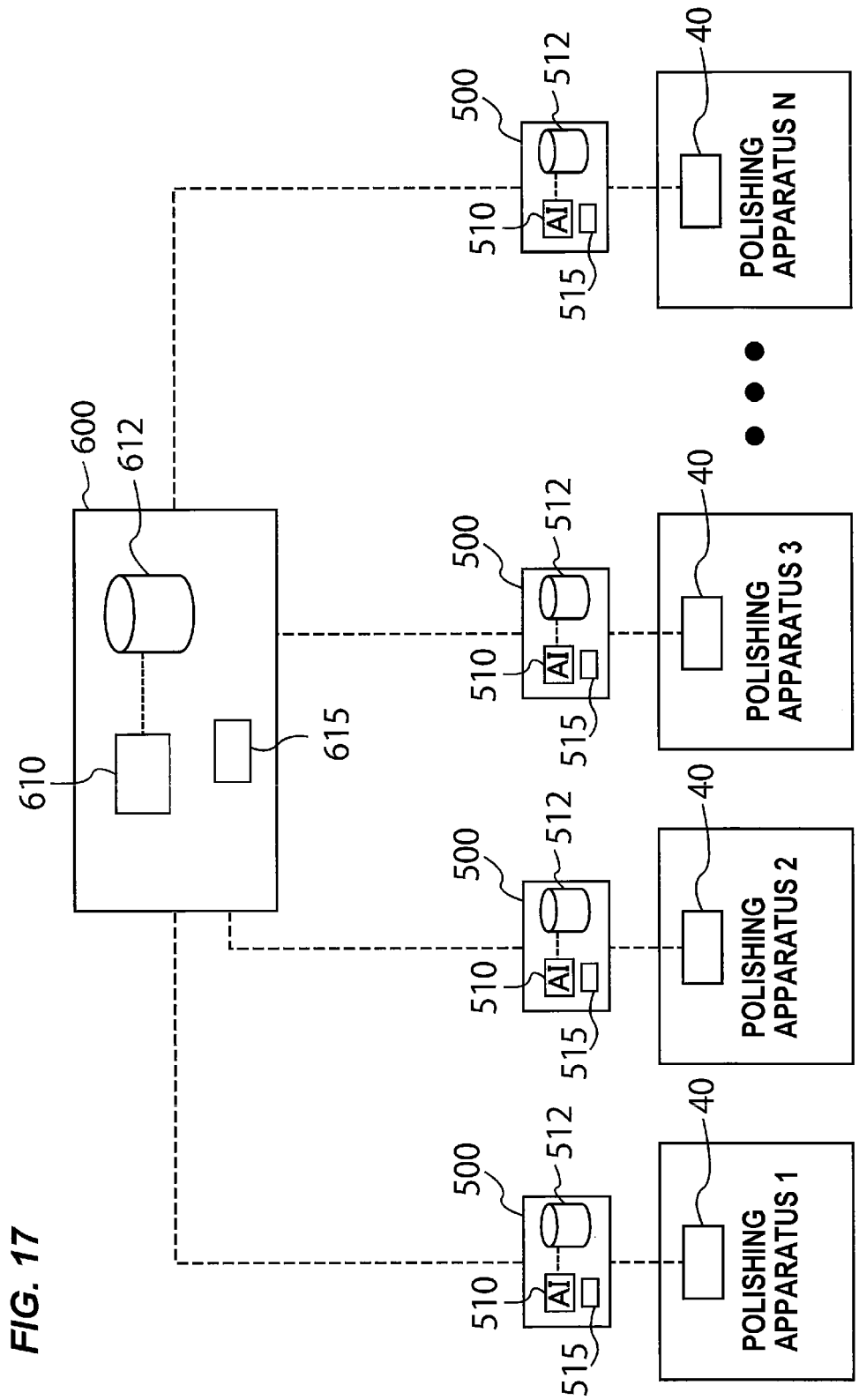
FIG. 17 is a schematic view showing another embodiment of the polishing system including at least one polishing apparatus.

FIG. 17 is a schematic view showing another embodiment of the polishing system including at least one polishing apparatus. Configuration of this embodiment, which is not specifically described, is the same as that of the embodiment shown in FIG. 16, and thus duplicate descriptions thereof are omitted.

In the embodiment shown in FIG. 17, the relay controller 510 of the relay device 500 determines the PID parameters (at least one temperature behavior parameter) to be changed and the change values thereof in order to put the temperature behavior curve within the predetermined allowable range by use of artificial intelligence (AI). In this case, the polishing system is constructed as an edge computing system where the relay device 500 is located near the polishing apparatus. The relay memory 512 of the relay device 500 stores in advance the learned model described with reference to FIGS. 10 to 15. For convenience of explanation, the learned model stored in the relay memory 512 is referred to as "learned model 3".

The relay controller 510 has a processing device (not shown) which corresponds to the processing device 120 shown in FIG. 5. The learned model 3 stored in the relay memory 512 is a learned model constructed by machine learning to maintain the temperature behavior curve R within the predetermined allowable range, similar to the learned model 1. In the learned model 3, every time the pad-temperature measuring device 39 measures the pad surface temperature, the measured values of the pad-temperature measuring device 39 and the measurement time points thereof are input to the input layer 301 in addition to at least one temperature behavior parameter. The learned model 3 is constructed such that PID parameters and changed values thereof are output from the output layer 303 from time to time so as not to deviate the measured values of the pad-temperature measuring device 39 from the predetermined allowable range. In other words, the learned model 3 is constructed to input from time to time to the input layer 301 the combination of the measured values of the pad-temperature measuring device 39 and the measurement time points which are sent during regulating of the pad surface temperature, to predict in real time whether or not the temperature behavior curve R becomes deviated from the predetermined allowable range, and to output the PID parameters to be changed and the change values thereof from the output layer 303 from time to time.

The processing device of the relay controller 510 reads the learned model 3 stored in the relay memory 512, and inputs at least one temperature behavior parameter to the input layer 301, and together inputs from time to time to the input layer 301 the combination of the measured values of the pad-temperature measuring device 39 and the measurement time points thereof, which are sent during regulating of the pad surface temperature. Further, the processing device of the relay controller 510 performs the calculations to predict in real time whether or not the temperature behavior curve R becomes deviated from the predetermined allowable range, and to output in real time the PID parameters to be changed and the change values thereof from the output layer 303. The calculated PID parameters and the change values thereof are output from the output layer 303 from time to time during regulating of the pad surface temperature. The relay controller 510 of the relay device 500 transmits the PID parameters and the change values thereof, output from the output layer 303, to the controller 40 of the polishing apparatus.

After receiving the PID parameters to be changed and the change values thereof, the controller 40 of the polishing apparatus regulates the pad surface temperature while changing from time to time the PID parameters to the received change values.

In this embodiment, the relay device 500 predicts the PID parameters to be changed and the change values thereof from time to time during polishing of the wafer W, and immediately sends the predicted PID parameters and the predicted change values to the polishing apparatus. Therefore, the temperature behavior curve R can be effectively prevented from deviating from the predetermined allowable range.

In the polishing system of this embodiment, the relay controller 510 of the relay device 500 can process at high speed the diagnostic results of the at least one temperature behavior parameter to be changed and the change value thereof in order to put the temperature behavior curve R within the predetermined allowable range, and output that results to the polishing apparatus. On the other hand, information that is not required to be processed at high speed (for example, status information of each polishing unit) is transmitted from the polishing apparatus to the host control system 600 via the relay device 500. As a result, the relay controller 510 of the relay device 500 is not required to perform unnecessary information processing, so that a determination of the PID parameters to be changed and the change value thereof can be processed at high speed.

In one embodiment, the "time" described above may be additionally input to the input layer 301 (or input layer 301') of the learned model 3. In this case, Further, the time described in the item 21) may be sent to the host control system 600 to be input to the learned model 1. In this case, the learned model 3 calculates each predicted value that matches the measurement time of the plurality of temperature behavior parameters based on the temporal changes of the plurality of temperature behavior parameters input other than the time, and outputs from time to time the PID parameters to be changed and the change values thereof based on this predicted value from the output layer 303. As a result, the temperature behavior curve R can be more effectively prevented from deviating from the predetermined allowable range.

Further, other temperature behavior parameters to be changed, which are different from the PID parameters, and the change values thereof in order to maintain the temperature behavior curve within the predetermined allowable range may be output from the output layer 303'. In this case, the controller 40 regulates the pad surface temperature while changing from time to time the PID parameters and the other temperature behavior parameters to those change values, so that the temperature behavior curve R can be more effectively prevented from deviating from the predetermined allowable range.

In one embodiment, the learned model 2 described above may be stored in the host memory 612 of the host control system 600. Alternatively, the learned model 3 described above may be stored in the memory 110 of the controller 40 of the polishing apparatus.

In the embodiments described above, the learned model 1 or the learned model 3 outputs the PID parameters to be changed and the change values thereof from the output layer 303. However the present invention is not limited to this example. For example, the learned model 1 or the learned model 3 may output from the output layer 303 the PID parameters to be changed, and a program for calculating the change values thereof. In this case, the controller 40 of the polishing apparatus, the relay controller 510 of the relay device 500, or the host controller 610 of the host control system 600 performs a process for calculating the change values of the PID parameters according to the program output from the output layer 303. Alternatively, the host controller 610 of the host control system 600, or the relay controller 510 of the relay device 500 performs the process for calculating the change values of the temperature behavior parameter according to the program output from the output layer 303, and sends those results to the polishing apparatus.

Alternatively, the learned model 1 or the learned model 3 may output from the output layer 303 the PID parameters to be changed, and the correction coefficients for calculating the values of the changed PID parameters. In this case, the controller 40 of the polishing apparatus, the relay controller 510 of the relay device 500, or the host controller 610 of the host control system 600 can obtain the values of the changed PID parameters by multiplying the correction coefficients output from the output layer 303 by the current PID parameters. Alternatively, the host controller 610 of the host control system 600 or the relay controller 510 of the relay device 500 can obtain the values of the changed PID parameters by multiplying the correction coefficients output from the output layer 303 by the current PID parameters, and send those values to the polishing apparatus.

Figure 18:
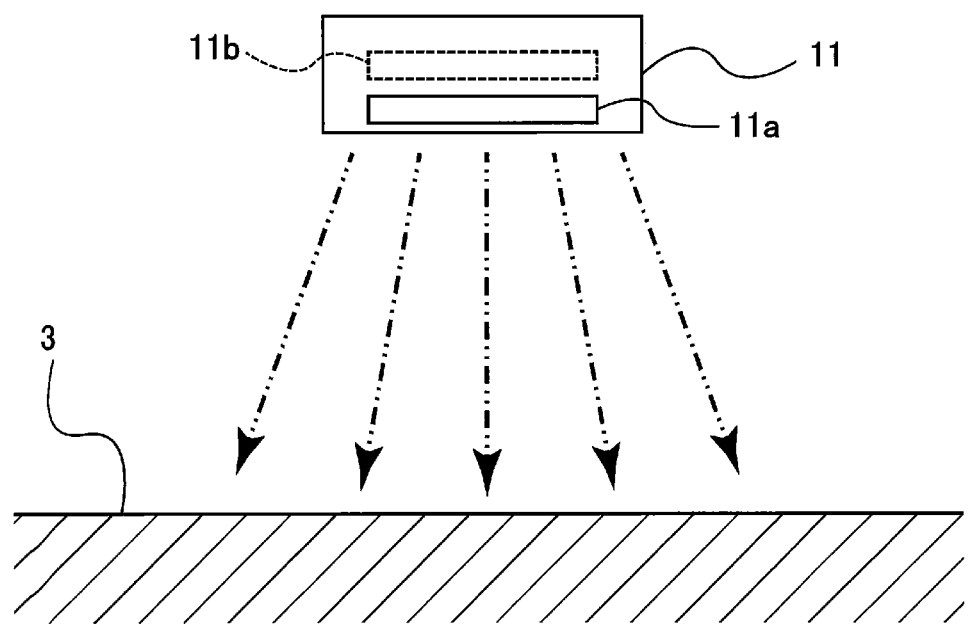
FIG. 18 is a schematic view showing a state in which a pad-temperature regulating member spaced upward from the polishing pad regulates the pad surface temperature.

In the embodiments described above, the pad contact member (pad-temperature regulating member) 11 used for reaching and subsequently maintaining the pad surface temperature at the predetermined target temperature is placed in contact with the surface (i.e. the polishing surface) of the polishing pad 3. However, as shown in FIG. 18, the pad contact member 11 may be spaced upward from the surface of the polishing pad 3. In this case, the member with the reference numeral 11 in FIG. 18 functions as a pad-temperature regulating member that regulates the pad surface temperature in a non-contact manner, and thus will be referred to as the "pad-temperature regulating member" below.

The pad-temperature regulating member 11 includes a pad heating source 11*a* for heating the surface of the polishing pad 3 in a non-contact manner. In one embodiment, the pad-temperature regulating member 11 may be the pad heating source 11*a* itself. Examples of the pad heating source 11*a* include a heater (in particular, an infrared heater) or a lamp (in particular, an infrared lamp) that emits radiant heat toward the surface of the polishing pad 3. When the pad heating source 11*a* is the heater or the lamp, the "temperature of the heating liquid" of the temperature behavior parameters described above is replaced with "temperature of the pad heating source".

Other example of the pad heating source 11*a* include a heated fluid injector that injects heated fluid, such as hot air, hot water, and superheated steam, onto the surface of the polishing pad 3. When the pad heating source 11*a* is a heated fluid injector, the heated fluid is supplied to the pad heating source 11*a* through a supply line not shown in the drawing. Furthermore, "flow rate of the heating liquid" of the temperature behavior parameters described above is replaced with "injection amount of the heated fluid," and "temperature of the heating liquid" is read as "temperature of the heated fluid.

The pad temperature regulating member 11 may further include a pad cooling source 11*b* for cooling the surface of the polishing pad 3 in a non-contact manner. In FIG. 18, the pad cooling source 11*b* is illustrated by imaginary line (dotted line). Examples of the pad cooling source 11*b* include a cooling fluid injector for injecting cooling fluid, such as cold air and cold water, onto the surface of the polishing pad 3. When the pad cooling source 11*b* is a cooling fluid injector, the cooling fluid is supplied to the pad cooling source 11*b* through a supply line not shown in the drawing. Furthermore, "flow rate of the cooling fluid" of the temperature behavior parameters described above is replaced with "injection amount of cooling fluid" and "temperature of the cooling fluid" of the temperature behavior parameters described above is replaced with "temperature of the cooling fluid".

Other examples of the pad cooling source 11*b* include a coolant injector that injects coolant, such as dry ice, onto the surface of the polishing pad 3. When the pad cooling source 11*b* is a coolant injector, the coolant is supplied to the pad cooling source 11*b* through a supply line not shown in the drawing. Furthermore, "flow rate of the cooling liquid" of the temperature behavior parameters described above is replaced with "amount of coolant injected", and "temperature of the cooling liquid" is replaced with "temperature of the coolant".

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a pad-temperature regulating apparatus and a pad-temperature regulating method for regulating a surface temperature of a polishing pad used for polishing a substrate, such as a wafer. Further, the present invention is applicable to a polishing apparatus in which the pad-temperature regulating apparatus is incorporated, and a polishing system including at least one polishing apparatus.

REFERENCE SIGNS LIST 1 polishing head
2 polishing table
3 polishing pad
4 polishing liquid supply nozzle
5 pad-temperature regulating apparatus
11 pad contact member (pad-temperature regulating member)
30 liquid supply system
31 heating-liquid supply tank
32 heating-liquid supply pipe
33 heating-liquid return pipe
39 pad-temperature measuring device
40 controller
41 first on-off valve
42 first flow control valve
47 heating liquid pump
48 heating source
51 cooling-liquid supply pipe
52 cooling-liquid discharge pipe
55 second on-off valve
56 second flow control valve
61 heating flow passage
62 cooling flow passage
110 memory
120 processing device
150 communication device
301 input layer
302 hidden layer
303 output layer
500 relay device
510 relay controller
512 relay memory
600 host control system
610 host controller
612 host memory

The invention claimed is:

1. A pad-temperature regulating apparatus for reaching a temperature of a surface of a polishing pad to a predetermined target temperature and then maintaining the temperature of the surface of the polishing pad at the target temperature, comprising:
a pad contact member which can be placed into contact with the surface of the polishing pad, and has a heating flow passage and a cooling flow passage formed therein;
a liquid supply system which includes a heating-liquid supply pipe coupled to the heating flow passage, a cooling-liquid supply pipe coupled to the cooling flow passage, a first flow control valve attached to the heating-liquid supply pipe, and a second flow control valve attached to the cooling-liquid supply pipe, and supplies a heating liquid having a regulated temperature and a cooling liquid having a regulated temperature, into the pad contact member;
a pad-temperature measuring device for measuring the temperature of the surface of the polishing pad; and
a controller for performing a PID control of manipulated variables of the first flow control valve and the second flow control valve based on a difference between a measured value of the pad-temperature measuring device and the predetermined target temperature,
wherein the controller includes:
a memory in which a learned model constructed by machine learning to maintain a temperature behavior curve, which is created based on measured values of the pad-temperature measuring device and measurement time points thereof, and which represents a temporal change in the temperature of the surface of the polishing pad from a time point when the pad contact member starts regulating of the temperature of the surface of the polishing pad to a time point when the target temperature is reached, within a predetermined allowable range, is stored; and
a processing device which inputs at least one temperature behavior parameter to the learned model, and performs a calculation to output a change value of PID parameter for the PID control.

2. The pad-temperature regulating apparatus according to claim 1, wherein the learned model is constructed by deep learning by use of neural network, and
the controller constructs the learned model by adjusting weight parameters of the neural network such that, when a training data set including the at least one temperature behavior parameter is input to the neural network, the PID parameter to be changed to maintain the temperature behavior curve within the predetermined allowable range and the change value of the PID parameter included in normal range are obtained from the neural network.

3. The pad-temperature regulating apparatus according to claim 2, wherein the controller stores the temperature behavior curves which are created every time a substrate is pressed against the polishing pad to be polished, and the at least one temperature behavior parameter associated with the temperature behavior curve, and
the training data set is produced from the accumulated at least one temperature behavior parameter.

4. The pad-temperature regulating apparatus according to claim 1, wherein the at least one temperature behavior parameter input to the learned model includes the PID parameter of the PID control, a flow rate of the heating liquid, and a flow rate of the cooling liquid.

5. The pad-temperature regulating apparatus according to claim 4, wherein a temperature of the heating liquid, a rotation speed of a polishing head for presses a substrate against the polishing pad, a rotation speed of a polishing table to which the polishing pad is attached, dressing conditions of the polishing pad, a polishing load of the polishing head, and a flow rate of a polishing liquid supplied onto the polishing pad are further input to the learned model.

6. The pad-temperature regulating apparatus according to claim 4, wherein a pressing load of the pad contact member against the polishing pad, a temperature of a polishing liquid supplied onto the polishing pad, a temperature of atmosphere in a polishing unit in which the pad temperature regulating apparatus is arranged, a supply pressure of the heating liquid, and a supply pressure of the cooling liquid are further input to the learned model.

7. The pad-temperature regulating apparatus according to claim 4, wherein a time when the at least one temperature behavior parameter input to the learned model has been acquired is further input to the learned model.

8. The pad-temperature regulating apparatus according to claim 1, wherein a film thickness parameter associated with a film thickness of a substrate pressed against the polishing pad is further input to the learned model.

9. The pad-temperature regulating apparatus according to claim 1, wherein a height of the polishing pad and a polishing rate of a substrate polished by the polishing pad are further input to the learned model.

10. A pad-temperature regulating method, comprising:
flowing a heating liquid and a cooling liquid into a heating flow channel and a cooling flow channel formed in a pad contact member, while the pad contact member is placed in contact with a surface of a polishing pad;
measuring a temperature of the surface of the polishing pad;
performing a PID control of manipulated variables of a first flow control valve attached to a heating-liquid supply pipe which is coupled to the heating flow channel, and a second flow control valve attached to a cooling-liquid supply pipe which is coupled to the cooling flow channel such that the temperature of the surface of the polishing pad reach a predetermined target temperature and is subsequently maintained at the target temperature;
constructing a learned model, by use of machine learning, a learned model for maintaining a temperature behavior curve, which is created based on measured values of the pad temperature measuring device and measurement time points thereof, and which represents a temporal change in the temperature of the surface of the polishing pad from a time point when the pad contact member starts regulating of the temperature of the surface of the polishing pad to a time point when the target temperature is reached, within a predetermined allowable range; and
inputting at least one temperature behavior parameter to the learned model and outputting the change value of a PID parameter of the PID control.

11. The pad-temperature regulating method according to claim 10, wherein constructing the learned model is being performed by a deep learning by use of neural network, and
the deep learning constructs the learned model by adjusting weight parameters of the neural network such that, when a training data set including the at least one temperature behavior parameter is input to the neural network, the PID parameter to be changed to maintain the temperature behavior curve within the predetermined allowable range and the change value of the PID parameter included in normal range are obtained from the neural network.

12. The pad-temperature regulating method according to claim 11, further comprising:
storing the temperature behavior curves which are created every time a substrate is pressed against the polishing pad to be polished, and the at least one temperature behavior parameter associated with the temperature behavior curve,
wherein the training data set is produced from the accumulated at least one temperature behavior parameter.

13. The pad-temperature regulating method according to claim 10, wherein the at least one temperature behavior parameter input to the learned model includes the PID parameter of the PID control, a flow rate of the heating liquid, and a flow rate of the cooling liquid.

14. The pad-temperature regulating method according to claim 13, wherein a temperature of the heating liquid, a rotation speed of a polishing head for presses a substrate against the polishing pad, a rotation speed of a polishing table to which the polishing pad is attached, dressing conditions of the polishing pad, a polishing load of the polishing head, and a flow rate of a polishing liquid supplied onto the polishing pad are further input to the learned model.

15. The pad-temperature regulating method according to claim 13, wherein a pressing load of the pad contact member against the polishing pad, a temperature of a polishing liquid supplied onto the polishing pad, a temperature of atmosphere in a polishing unit in which the pad temperature regulating apparatus is arranged, a supply pressure of the heating liquid, and a supply pressure of the cooling liquid are further input to the learned model.

16. The pad-temperature regulating method according to claim 13, wherein a time when the at least one temperature behavior parameter input to the learned model has been acquired is further input to the learned model.

17. The pad-temperature regulating method according to claim 10, wherein a film thickness parameter associated with a film thickness of a substrate pressed against the polishing pad is further input to the learned model.

18. The pad-temperature regulating method according to claim 10, wherein a height of the polishing pad and a polishing rate of a substrate polished by the polishing pad are further input to the learned model.

19. A polishing apparatus, comprising:
at least one polishing unit including a polishing table for supporting a polishing pad, and a polishing head for pressing a substrate against the polishing pad; and
a pad-temperature regulating apparatus for reaching a temperature of a surface of the polishing pad to a predetermined target temperature and then maintaining the temperature of the surface of the polishing pad at the target temperature,
wherein the pad-temperature regulating apparatus includes:
a pad contact member which can be placed into contact with the surface of the polishing pad, and has a heating flow passage and a cooling flow passage formed therein;
a liquid supply system which includes a heating-liquid supply pipe coupled to the heating flow passage, a cooling-liquid supply pipe coupled to the cooling flow passage, a first flow control valve attached to the heating-liquid supply pipe, and a second flow control valve attached to the cooling-liquid supply pipe, and supplies a heating liquid having a regulated temperature and a cooling liquid having a regulated temperature, into the pad contact member;
a pad-temperature measuring device for measuring the temperature of the surface of the polishing pad; and
a controller for performing a PID control of manipulated variables of the first flow control valve and the second flow control valve based on a difference between a measured value of the pad-temperature measuring device and the predetermined target temperature,
wherein the controller includes:
a memory in which a learned model constructed by machine learning to maintain a temperature behavior curve, which is created based on measured values of the pad-temperature measuring device and measurement time points thereof, and which represents a temporal change in the temperature of the surface of the polishing pad from a time point when the pad contact member starts regulating of the temperature of the surface of the polishing pad to a time point when the target temperature is reached, within a predetermined allowable range, is stored; and
a processing device which inputs at least one temperature behavior parameter to the learned model, and performs a calculation to output a change value of PID parameter for the PID control.

20. The polishing apparatus according to claim 19, wherein the learned model is constructed by deep learning by use of neural network, and
the controller constructs the learned model by adjusting weight parameters of the neural network such that, when a training data set including the at least one temperature behavior parameter is input to the neural network, the PID parameter to be changed to maintain the temperature behavior curve within the predetermined allowable range and the change value of the PID parameter included in normal range are obtained from the neural network.

21. A polishing system, comprising:
at least one polishing apparatus;
a relay device coupled to the polishing unit so as to be capable of transmitting and receiving information with each other; and
a host control system coupled to the relay device so as to be capable of transmitting and receiving information with each other,
wherein the polishing apparatus includes:
at least one polishing unit including a polishing table for supporting a polishing pad, and a polishing head for pressing a substrate against the polishing pad; and
a pad-temperature regulating apparatus for reaching a temperature of a surface of the polishing pad to a predetermined target temperature and then maintaining the temperature of the surface of the polishing pad at the target temperature,
wherein the pad-temperature regulating apparatus includes:
a pad contact member which can be placed into contact with the surface of the polishing pad, and has a heating flow passage and a cooling flow passage formed therein;
a liquid supply system which includes a heating-liquid supply pipe coupled to the heating flow passage, a cooling-liquid supply pipe coupled to the cooling flow passage, a first flow control valve attached to the heating-liquid supply pipe, and a second flow control valve attached to the cooling-liquid supply pipe, and supplies a heating liquid having a regulated temperature and a cooling liquid having a regulated temperature, into the pad contact member;
a pad-temperature measuring device for measuring the temperature of the surface of the polishing pad; and
a controller for performing a PID control of manipulated variables of the first flow control valve and the second flow control valve based on a difference between a measured value of the pad-temperature measuring device and the predetermined target temperature, and
wherein a host controller of the host control system includes:
a memory in which a learned model constructed by machine learning to maintain a temperature behavior curve, which is created based on measured values of the pad-temperature measuring device and measurement time points thereof, and which represents a temporal change in the temperature of the surface of the polishing pad from a time point when the pad contact member starts regulating of the temperature of the surface of the polishing pad to a time point when the target temperature is reached, within a predetermined allowable range, is stored; and
a processing device which inputs at least one temperature behavior parameter to the learned model, and performs a calculation to output a change value of PID parameter for the PID control.

22. A polishing system, comprising:
at least one polishing apparatus;
a relay device coupled to the polishing unit so as to be capable of transmitting and receiving information with each other; and
a host control system coupled to the relay device so as to be capable of transmitting and receiving information with each other,
wherein the polishing apparatus includes:
at least one polishing unit including a polishing table for supporting a polishing pad, and a polishing head for pressing a substrate against the polishing pad; and
a pad-temperature regulating apparatus for reaching a temperature of a surface of the polishing pad to a predetermined target temperature and then maintaining the temperature of the surface of the polishing pad at the target temperature,
wherein the pad-temperature regulating apparatus includes:
a pad contact member which can be placed into contact with the surface of the polishing pad, and has a heating flow passage and a cooling flow passage formed therein;
a liquid supply system which includes a heating-liquid supply pipe coupled to the heating flow passage, a cooling-liquid supply pipe coupled to the cooling flow passage, a first flow control valve attached to the heating-liquid supply pipe, and a second flow control valve attached to the cooling-liquid supply pipe, and supplies a heating liquid having a regulated temperature and a cooling liquid having a regulated temperature, into the pad contact member;
a pad-temperature measuring device for measuring the temperature of the surface of the polishing pad; and
a controller for performing a PID control of manipulated variables of the first flow control valve and the second flow control valve based on a difference between a measured value of the pad-temperature measuring device and the predetermined target temperature, and
wherein a relay controller of the relay device includes:
a memory in which a learned model constructed by machine learning to maintain a temperature behavior curve, which is created based on measured values of the pad-temperature measuring device and measurement time points thereof, and which represents a temporal change in the temperature of the surface of the polishing pad from a time point when the pad contact member starts regulating of the temperature of the surface of the polishing pad to a time point when the target temperature is reached, within a predetermined allowable range, is stored; and
a processing device which inputs at least one temperature behavior parameter to the learned model, and performs a calculation to output a change value of PID parameter for the PID control.

* * * * *